United States Patent [19]
Yoshida et al.

[11] Patent Number: 5,663,975
[45] Date of Patent: Sep. 2, 1997

[54] MULTI-BEAM SEMICONDUCTOR LASER WITH SEPARATED CONTACTS CHARACTERIZED BY SEMICONDUCTOR MIXED CRYSTAL AND ACTIVE LAYER

[75] Inventors: Ichiro Yoshida; Tsukuru Katsuyama; Junichi Hashimoto, all of Yokohama, Japan

[73] Assignee: Sumitomo Electric Industries, Ltd., Osaka, Japan

[21] Appl. No.: 417,272

[22] Filed: Apr. 5, 1995

Related U.S. Application Data

[63] Continuation of Ser. No. 29,411, Mar. 11, 1993, abandoned.

[30] Foreign Application Priority Data

| Mar. 11, 1992 | [JP] | Japan | 4-052427 |
| Jun. 3, 1992 | [JP] | Japan | 4-142949 |
| Jun. 8, 1992 | [JP] | Japan | 4-147218 |
| Jun. 8, 1992 | [JP] | Japan | 4-147219 |
| Jun. 9, 1992 | [JP] | Japan | 4-149490 |
| Jun. 9, 1992 | [JP] | Japan | 4-149493 |
| Aug. 24, 1992 | [JP] | Japan | 4-224130 |

[51] Int. Cl.$^6$ ........................... H01S 3/19
[52] U.S. Cl. .................. 372/46; 372/45; 372/50; 372/34
[58] Field of Search .................. 372/45, 46, 50, 372/43, 44, 34

[56] References Cited

U.S. PATENT DOCUMENTS

| 4,069,463 | 1/1978 | McGroddy et al. | 372/36 |
| 4,531,217 | 7/1985 | Kitamura | 372/50 |
| 4,813,054 | 3/1989 | Plumb | 372/45 X |
| 4,916,710 | 4/1990 | Hattori | 372/50 |
| 4,956,682 | 9/1990 | Ohnaka et al. | 372/50 X |
| 5,029,175 | 7/1991 | Ohnaka et al. | 372/46 |
| 5,101,246 | 3/1992 | Onodera | 372/50 X |
| 5,140,605 | 8/1992 | Paoli et al. | 372/50 |
| 5,157,680 | 10/1992 | Goto | 372/50 |
| 5,170,402 | 12/1992 | Ogita et al. | 372/50 X |

FOREIGN PATENT DOCUMENTS

| 282331 | 9/1988 | European Pat. Off. |
| 350327 | 1/1990 | European Pat. Off. |
| 356302 | 2/1990 | European Pat. Off. |
| 405800 | 1/1991 | European Pat. Off. |

(List continued on next page.)

OTHER PUBLICATIONS

Patent Abstracts of Japan, vol. 5, No. 186 (E-84)(858) 25 Nov. 1981 & JP-A-56 112 789 (Tokyo Shibaura Denki) 5 Sep. 1981 * abstract *.

(List continued on next page.)

*Primary Examiner*—Rodney B. Bovernick
*Assistant Examiner*—Hemang Sanghavi
*Attorney, Agent, or Firm*—Cushman Darby & Cushman, L.L.P.

[57] ABSTRACT

This semiconductor laser includes resistors as heating means through insulation films for generating pre-heat of substantially the same calorie as oscillation heat generated when the laser resonator are driven. When the light emitting regions as the light source are driven, first the heating means is actuated to give pre-heat to the laser resonators. After the laser resonators are driven, the heating means is stopped to decrease a calories of the pre-heat. It is preferable that the pre-heat has substantially the same calories as the above-described generated heat, but may be below the generated heat. Specifically, when all of the two laser resonators are driven, the heating means may generate a calories for one laser beam so as to suppress the heat crosstalks due to the mutual influence of the heat generation of the laser beams. In this case, the heating means stops heating only while both laser resonators are being driven, and continues heating in other cases. Thus, whether or not one and/or the other of the light emitting regions is driven, the laser chip has a substantially constant temperature, and temperature changes before and after an actuation is suppressed. As a result, laser beams of uniform output levels can be supplied to the printing unit of a laser printer.

22 Claims, 21 Drawing Sheets

FOREIGN PATENT DOCUMENTS

| | | | |
|---|---|---|---|
| 449636 | 10/1991 | European Pat. Off. | |
| 61-214591 | 9/1986 | Japan | 372/46 |
| 63-102386 | 7/1988 | Japan | 372/43 |
| 1-281786 | 11/1989 | Japan. | |
| 3-225985 | 10/1991 | Japan | 372/45 |
| 2224374 | 5/1990 | United Kingdom. | |

OTHER PUBLICATIONS

Patent Abstracts of Japan, vol. 9, No. 65 (E–304)(1788) 26 Mar. 1985 & JP–A–59 204 292 (Canon) 19 Nov. 1984 * abstract *.

Patent Abstracts of Japan, vol. 11, No. 99 (E–493) 27 Mar. 1987 & JP–A–61 248 584 (NEC) 5 Nov. 1986 * abstract *.

Patent Abstracts of Japan, vol. 14, No. 469 (M–1034) 12 Oct. 1990 & JP–A–02 187 369 (Fuji Xerox) 23 Jul. 1990 * abstract *.

Patent Abstracts of Japan, vol. 14, No. 002 (E–868) 8 Jan. 1989 & JP–A–01 251 686 (Canon) 6 Oct. 1989 * abstract *.

Patent Abstracts of Japan, vol. 16, No. 87 (M–1217) 3 Mar. 1992 & JP–A–03 268 960 (Fujitsu) 29 Nov. 1991 * abstract *.

Patent Abstracts of Japan, vol. 11, No. 119 (E–499) 14 Apr. 1987 & JP–A–61 265 885 (NEC) 25 Nov. 1986 * abstract *.

Patent Abstracts of Japan, vol. 14, No. 469 (M–1034) 12 Oct. 1990 re JP–A–02 187 369.

Patent Abstracts of Japan, vol. 15, No. 288 (E–1092) 22 Jul. 1991 re JP–A–03 101 179.

Patent Abstracts of Japan, vol. 14, No. 396 (E–970) 27 Aug. 1990 re JP–A–02 150 088.

Patent Abstracts of Japan, vol. 14, No. 541 (E–1007) 29 Nov. 1990 re JP–A–02 230 783.

Patent Abstracts of Japan, vol. 15, No. 258 (E–1084) 28 Jun. 1991 re JP–A–03 083 387.

Patent Abstracts of Japan, vol. 14, No. 368 (E–962) 9 Aug. 1990 re JP–A–02 132 930.

Patent Abstracts of Japan, vol. 14, No. 218 (E–925) 9 May 1990 re JP–A–02 054 589.

Patent Abstracts of Japan, vol. 9, No. 19 (E–292) 25 Jan. 1985 re JP–A–59 165 487.

Al–Maghdoub et al., High–Power AlGaInP Three–Ridge Type Laser Diode Array, Electronics Letters, vol. 24, No. 6, Mar. 17, 1988, pp. 326–327.

Kapon et al., Phase–locking characteristics of coupled ridge––waveguide InP/InGaAsP diode lasers, Appl Phys. Lett. 45 (11), Dec. 1, 1984, pp. 1159–1161.

Patent Abstracts of Japan, vol. 9, No. 143 (E–322) (1866) 18 Jun. 1985 re JP–A–60 024 083.

Patent Abstracts of Japan, vol. 9, No. 240 (E–345) (1963) 26 Sep. 1985 re JP–A–60 089 990.

Dutta et al., Monitoring the performance of a semiconductor optical amplifier, Applied Physics Letters, 57, Aug. 1990, No. 7, pp. 659–660.

Patent Abstracts of Japan, vol. 11, No. 95 (E–492) (2542) 25 Mar. 1987 re JP–A–61 247083.

Patent Abstracts of Japan, vol. 10, No. 61 (E–387) (2118) 11 Mar. 1986 re JP–A–60 211992.

Brady e al, Silicon Leadless Insertion Device For Laser Diode Alignment And Contacting, IBM Technical Disclosure Bulletin, vol. 25, No. 11A, Apr. 1983.

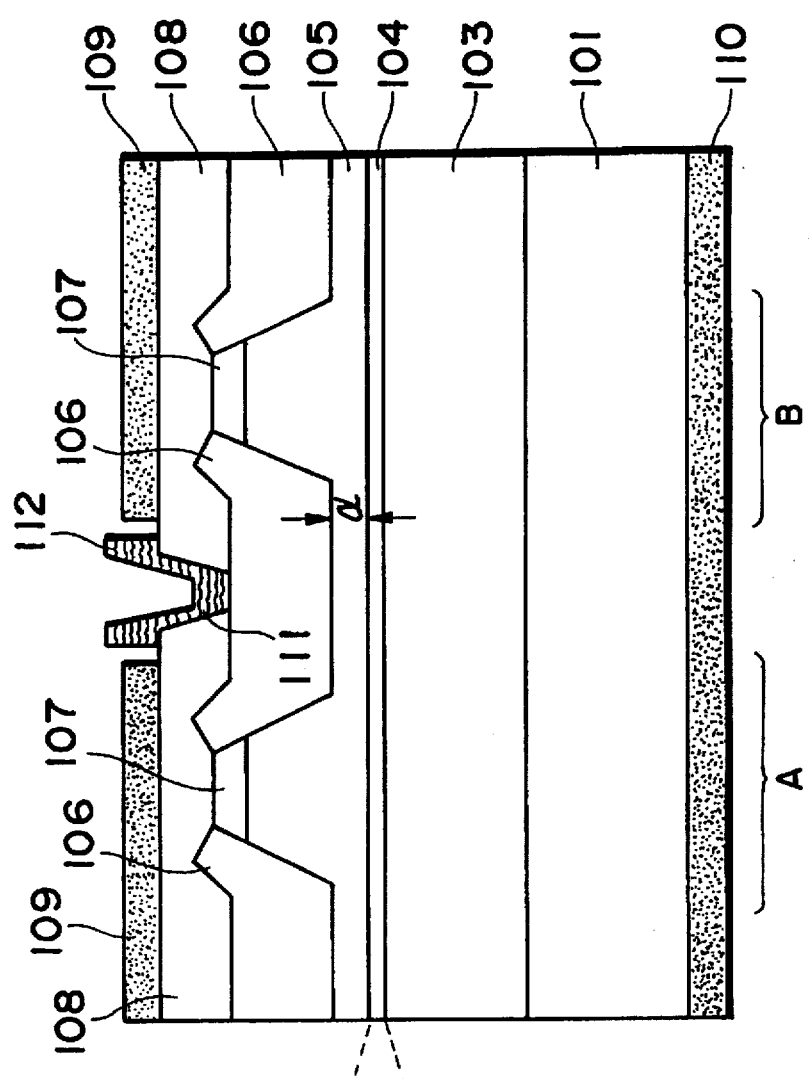
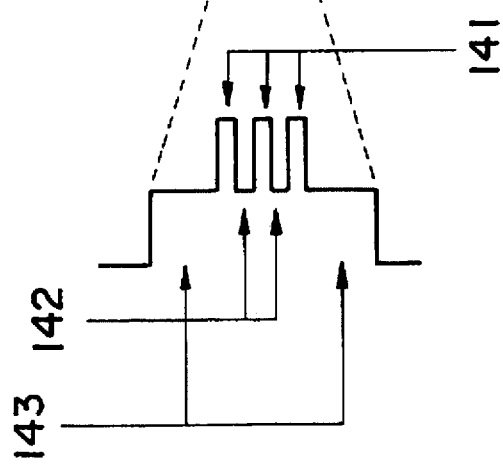
Fig. 1A
Fig. 1B

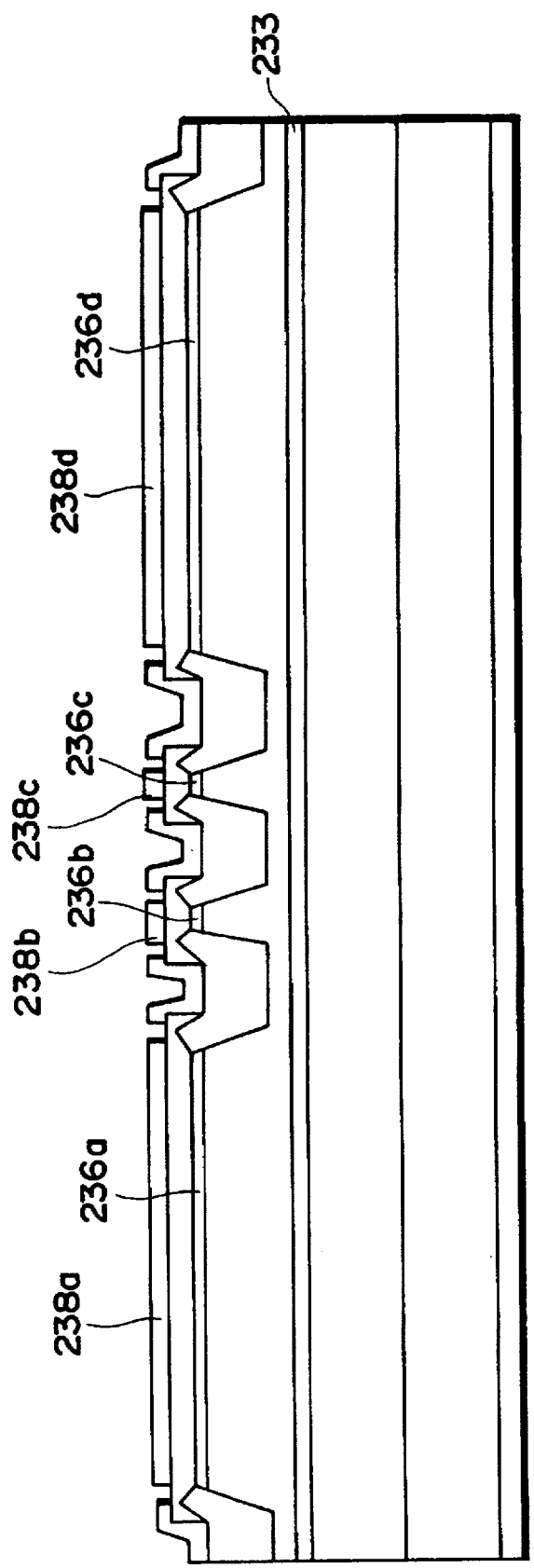

MULTI-BEAM SEMICONDUCTOR LASER WITH SEPARATED CONTACTS CHARACTERIZED BY SEMICONDUCTOR MIXED CRYSTAL AND ACTIVE LAYER

This is a continuation of Application Ser. No. 08/029,411, filed on Mar. 11, 1993, which is now abandoned.

BACKGROUND OF THE INVENTION

1. Field of the Invention

This invention relates to art of improving the reliability of semiconductor lasers, and the stability of the laser output, mainly to a multi-beam semiconductor laser including a plurality of light emitting regions which are formed on one and the same semiconductor substrate and can be driven independently from each other.

2. Related Background Art

Presently semiconductor lasers are widely used in laser printers and optical disk memory systems, but writing rates of the printers and data transmission rates of the optical disks are not always sufficiently high. In such circumstances, it is expected that if it is possible to neighbor two laser beam emitting regions to each other independently operative on one and the same semiconductor laser substrate, then systems having twice writing rates or data transmission rates with one optical system will be realized. To this end, recently such multi-beam semiconductor lasers have been studied. Lasers which are currently used in such applications are AlGaAs-based and have wavelengths of 0.78~0.84 μm. As the art for the electrical isolation of the beam emitting regions in lasers of this material are known diffusion of impurities between the beam emitting regions for higher resistances, etching recesses deeper than the active layers in the steps of forming the beam emitting regions and burying the etched recesses with low-refractive index higher resistance crystals, and so on.

On the other hand, AlGaInP-based infrared semiconductor lasers of wavelengths of 0.6~0.7 μm have been developed. The replacement of AlGaAs-based semiconductor lasers with AlGaInP-based semiconductor lasers enables sensitive materials of high sensitivity to be used in laser printers, with a result that higher printing rates can be expected. In optical disks, it will be possible to more focus beam spots, with a result of larger capacities.

But the multi-beam art, which has been much studied on AlGaAs-based lasers, has not been much developed on AlGaInP-based lasers. That is, the application of the art of diffusing impurities between beam emitting regions for higher resistances or the art of etching recesses deeper than the active layers and burying the recesses with low-refractive index high-resistance crystals, which are multi-beam art for AlGaAs-based semiconductor lasers, to AlGaInP-based semiconductor lasers as it is does not produce sufficient characteristics of multi-beam semiconductor lasers in which the respective beams can be driven independently of each other. The art in which respective beams are driven not independently of each other but concurrently simply for higher outputs is known ("High-Power AlGaInP Three-Ridge Type LASER Diode Array", Electronics Letters, 17th, 1988, Vol. 24, No. 6).

The multi-beam semiconductor laser includes, on one laser chip, a plurality of laser resonators of independently driven type each including an oscillation region and a drive unit. When the multi-beam semiconductor laser is actuated, the drive units of required ones of the laser resonators are selected and each fed with a required voltage, and the respective selected drive units supply operating currents above a threshold current, so that the oscillation regions of the required laser resonators are driven to emit laser beams. These laser beams are led to light detecting mediums through optical systems, optical fibers, etc.

In driving laser resonators, an output level of the laser beams is high immediately after an actuation, and the output level lowers as time passes. This is because, since none of the elements generate heat before the actuation, the oscillation regions can be easily excited to emit beams at a low threshold current, but, after the emission of the beams, emission heat of a set calorie is generated and raises a temperature of the laser chips, with the result that a higher current is required to set on the laser oscillation. A percentage of drop of a laser oscillation from an actuation of an Oscillation is called "droop ratio".

In the AlGaAs multi-beam semiconductor laser, because of high operating currents and relatively high heat resistance, heat conduction is apt to occur between the laser resonators. This results in large fluctuations of output levels of the beams emitted from the respective laser resonators, and low operational reliability of the semiconductor laser. To prevent the influence of the heat crosstalks, the laser resonators have to be formed spaced by a large distance from each other, a heat conduction-hindering member has to be provided therebetween, or other means are necessary. This has been a neck to the reduction of its fabrication costs.

The above-described heat crosstalks can be improved by improving the heat radiation of the chip. One of its methods is described in "The 1991 Autumn Convention of Applied Physics, 11p-ZM-18, Murata et al." This method will be briefed. The electrodes of a multi-beam laser are printed on a Si wafer to form an electrode board, and a chip with a multi-beam semiconductor laser fabricated on is die-bonded epidown (with the substrate up) to the electrode board. A radiator called heat-pass wire is provided on the side of the substrate. The provision of the heat-pass wire improves the heat radiation. But the heat crosstalks cannot be sufficiently suppressed.

The described-above means is effective for the prevention of changes of an output level of laser beams of the semiconductor lasers in continuous operations but does not work sufficiently to suppress changes of an output level of the laser beams immediately after the start of a drive.

Especially in the case that a plurality of laser beams are used, when one of the laser resonators is intermittently driven while the other laser resonator is being driven, an output level of the laser beams being emitted greatly changes due to heat changes and the interference caused by the heat changes.

This results in problems that in, e.g., laser printers, static latent images to be record patterns have disuniform densities, and images or letters have disuniform densities, and other problems.

In the case that a plurality of laser beams are used as a light emitting region of an optical disk, recording/reading of the memory of the optical disk cannot be correctly performed. In the case that a plurality of laser beams are used as a signal light emitting region of the optical communication, this results in the problem that changes of a signal level cause errors in demodulating data, and other problems.

The semiconductor lasers used in laser printers, optical disk memory systems and so on, have different lifetimes depending on their use conditions and environmental temperatures. Especially multi-beam semiconductor lasers generally have shorter lifetimes because of their disuniform characteristics of the respective laser beams. As a countermeasure, photo-diodes or others for the detection of the optical outputs are disposed near the semiconductor lasers for constantly monitoring levels of the outputs to confirm longevities of the semiconductor lasers and the prevention of system troubles.

But it has been very difficult to monitor output levels of individual laser beams because an interval between the laser beams is as small as 10 & 100 μm. Irrespective of single- or multi-beam semiconductor lasers, it is bothering to mount photo-diodes near the semiconductor lasers. Improvements have been expected. Furthermore, the monitoring takes into account actual temperatures of the semiconductor chips, sometimes it is difficult to judge longevities of the semiconductor lasers.

But, semiconductor lasers have different lifetimes depending on frequencies of their drives, their output levels, their environmental temperatures, etc., and it is impossible to exactly estimate their lifetimes. Factually their lifetimes cannot be told until they are put to actual uses. Sometimes, of the components of a system a semiconductor laser is least reliable. In such case, the reliability of the semiconductor laser determines the reliability of the system.

In such circumstances, conventionally means for detecting an output drop of a laser beam or means for detecting a threshold current increase are provided on the system, so that when a detected value exceeds a set allowable range, the termination of a lifetime of a semiconductor laser is judged, and the abnormality is indicated. At this time an operator displaces the abnormal semiconductor laser with a normal semiconductor laser.

But the system includes an optical system which is adjusted with high precision. Usually a new semiconductor laser has to be well positioned with respect to the optical system. It is a problem that this operation takes much time. Furthermore, drops of an output level of laser beams and increases of a threshold current are not always due to the termination of a lifetime of the semiconductor laser. For example, the same phenomenon takes place due to temperature changes caused by thermal crosstalks. As the result, because of the erroneous detection of the termination of the lifetime of the semiconductor laser, the unnecessary replacement of the semiconductor laser has been made.

On the other hand, in the case that a system uses parts of low reliability, it is general that supply parts of the same specifications are incorporated for high reliability of the system. But the system using a semiconductor laser, which has the optical system positionally adjusted, has to include an optical system which is exclusive for the supply parts, which makes the system very expensive.

SUMMARY OF THE INVENTION

According to the first aspect of this invention, this invention provides a semiconductor laser of a structure which can improve the heat radiation and effectively prevent the heat crosstalks.

According to the second aspect of this invention, this invention has been made to solve these problems, and provides a method for driving the semiconductor laser according to this invention, which includes a plurality of light emitting regions, which (method) can mitigate the influence of the heat interference of the light emitting regions, and a method for applying the semiconductor laser according to this invention.

According to the third aspect of this invention, this invention has been made to solve the above-described problem, and provides the semiconductor laser according to this invention, which has the function of monitoring respective laser beams and a method for applying the semiconductor laser, which can do by simples means the functions of monitoring individual laser beams, and temperatures of the laser chip.

According to the fourth aspect of this invention, this invention has been made to solve the above-described problem, and provides a semiconductor laser system which enables inexpensive, very reliable systems to be fabricated.

That is, to solve the above-mentioned problems, this invention is a multi-beam semiconductor laser comprising: an active layer; a first and second cladding layer sandwiching the active layer; a contact layer provided on the second cladding layer; dividing means provided for physically dividing the contact layer into two areas; and electrodes respectively provided on the divided areas of the contact layer; and heating means.

And this invention is a method for a driving a multi-beam semiconductor laser comprising an active layer; a first and second cladding layer sandwiching the active layer; a contact layer provided on the second cladding layer; dividing means provided for physically dividing the contact layer into two areas; and a first and a second electrode respectively provided on the divided areas of the contact layer, the method comprising the steps of: supplying current to alternative of the first electrode or the second electrode.

This invention is a method for driving a multi-beam semiconductor laser comprising an active layer; a first and second cladding layer sandwiching the active layer; a contact layer provided on the second cladding layer; dividing means provided for physically dividing the contact layer into two areas; and first and second electrodes respectively provided on the divided areas of the contact layer, the method comprising the steps of: keeping a total of supplying current to the first electrode and to the second electrodes substantially constant.

This invention is a multi-beam semiconductor laser comprising: an active layer; a first and second cladding layer sandwiching the active layer; a contact layer provided on the second cladding layer; dividing means provided for physically dividing the contact layer into two areas; and electrodes respectively provided on the divided areas of the contact layer, the active layer being formed of an undoped semiconductor mixed crystal, the first cladding layer being formed of a first conduction-type semiconductor mixed crystal, and the second cladding layer being formed of a second conduction-type semiconductor mixed crystal.

And this invention is a laser system which has a multi-beam semiconductor laser, comprising: a multi-beam semiconductor laser; deterioration detecting means; and driving switching means, and the multi-beam semiconductor laser comprising an active layer; a first and second cladding layer sandwiching the active layer; a contact layer provided on the second cladding layer; dividing means provided for physically dividing the contact layer into two areas; and a first and a second electrode respectively provided on the divided areas of the contact layer, the deterioration detecting means detecting deterioration of a region which emits a laser beam when current is supplied to the first electrode, and the driving switching means stopping the current supply to the first electrode when the deterioration detecting means has detected deterioration, and supplying current to the second electrode.

And also, this invention is a laser system which has a multi-beam semiconductor laser, comprising: a multi-beam semiconductor laser; deterioration detecting means; and driving switching means, and the multi-beam semiconductor laser having at least two beams; a first and a second beams being operated by supplying current to a first and a second electrode, respectively, and the deterioration detecting means detecting deterioration of a region which emits a laser beam when current is supplied to the first electrode, and the driving switching means stopping the current supply to the first electrode when the deterioration detecting means has detected deterioration, and supplying current to the second electrode.

Still more this invention is a semiconductor laser comprising: an active layer; a first and second cladding layer sandwiching the active layer; a contact layer provided on the second cladding layer; dividing means provided for physically dividing the contact layer into two areas; and a first and a second electrode respectively provided on the divided areas of the contact layer, a resistor, which electrically connected to the first electrodes, and converting into a voltage change an electric power change due to a laser beam from a region which generates the laser beam when current is supplied to the second electrode, an interval between the center of the region which generates the laser beam when current is supplied to the first electrode and that of a region which generates a laser beam When current is supplied to the second electrode is smaller than 15 µm.

And this invention is a method for measuring a chip temperature of a semiconductor laser comprising: an active layer; a first and second cladding layer sandwiching the active layer; a contact layer provided on the second cladding layer; dividing means provided for physically dividing the contact layer into two areas; and a first and a second electrode respectively provided on the divided areas of the contact layer, and a resistor which electrically connected to the first electrode, and converting into a voltage change an electric power change due to a laser beam from a region which generates the laser beam when current is supplied to the second electrode, an interval between the center of the region which generates the laser beam when current is supplied to the first electrode and that of a region which generates a laser beam when current is supplied to the second electrode is smaller than 15 µm; and the method comprising the step of: supplying a set current to the first electrode to measure a voltage of the first electrode when current is not supplied to the second electrode.

This invention is a process for fabricating a semiconductor laser including a semiconductor chip with laser resonators which is sandwiched between a substrate and an electrode plate, the process comprising: the first step of forming the semiconductor chip on the substrate; the second step of die bonding the semiconductor chip and the electrode plate; and the third step of thinning the substrate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIGS. 1A and 1B are sectional structural views of one example of a multi-beam semiconductor laser according to the semiconductor laser of this invention.

FIG. 8 is a sectional structural view of the semiconductor laser with four laser resonators.

DESCRIPTION OF THE PREFERRED EMBODIMENTS

Figure 2A:
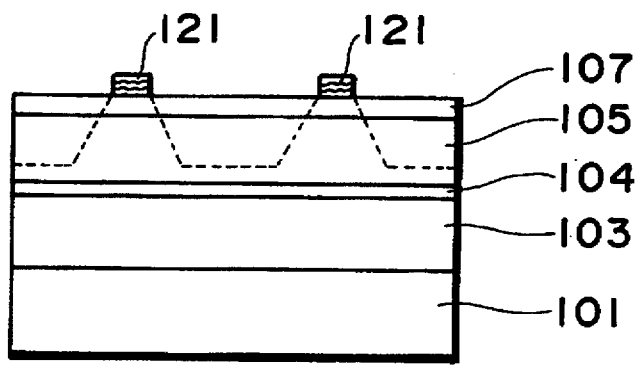
FIGS. 2A to 2D and 3A to 3D are sectional views of the steps of fabricating the multi-beam semiconductor laser of FIG. 1B.

To explain the semiconductor laser according to this invention, a sectional view of the semiconductor laser as one example is shown in FIG. 1B. This semiconductor laser is a multi-beam semiconductor laser including two light emitting regions which are independently driven of each other. A first cladding layer 103 of Se-doped AlGaInP and an active layer 104 are formed on a Si-doped GaAs substrate 101 in this order, and then a second cladding layer 105 of Zn-doped AlGaInP is formed on the active layer 104. The second cladding layer 105 has two mesa (projecting) portions which correspond to emission regions, and is so designed as to physically continuously cover the active layer 104. A cap layers 107 of Zn-GaInP is further formed on the flat top portion of each of the mesa portions.

In addition, current block layers 106 of Si-doped GaAs is formed on the second cladding layer 105 excluding those areas on which the cap layers 107 are formed. That is, the current block layer 107 is so formed as to be embedded between the two mesa portions (containing the both sides of the mesa portions) each comprising the cap layer 107 and the second cladding layer 105.

In addition, a contact layer 108 of Zn-doped GaAs is formed on the cap layers 107 and the current block layers 106. And a silicon nitride film 112, structurally separating the contact layer 108, is formed on the surface of the central portion of the current block layer 106 through which the two emission regions are separated from each other. That is, the silicon nitride film 112 is formed to bury an isolation groove 111 formed between a light emitting region A and a light emitting region B.

A positive electrode 109 is formed on each of the two separated contact layers 108, and a negative electrode 110 is formed on the back surface of the GaAs substrate 101. A buffer layer may be formed between the substrate 101 and the cladding layer 103.

The semiconductor laser according to this embodiment can be said to be an AlGaInP-based semiconductor laser, but what is called AlGaInP-based here includes semiconductor lasers having the active layers which have zero aluminum composition ratio, i.e., is GaInP, and the cladding layer which has zero Ga composition ratio, i.e., is AlInP. FIG. 1A is an energy band view of the strain quantum well structure of the active layer 104. As shown, the active layer 104 comprises 100 Å well layers 141 of undoped $Ga_{0.47}In_{0.57}P$, 80 Å-barrier layers of undoped $(Al_{0.4}Ga_{0.6})_{0.5}In_{0.5}P$ spacing the well layers 141, and 800 Å-light confining layers 143. It is known art that the active layer has such multi-quantum well structure. The use of the materials of the above-described composition ratios according to this embodiment gives the active layer a compression strain.

FIGS. 1A and 1B are schematic views, and all the dimensional ratios of the respective parts of the sectional view are not actual dimensional ratios. For example, actually the thickness of the GaAs substrate 101 is 70 μm, the total thickness from the cladding layer 103 to the cap layers 107 is 2~3 μm, and the thickness of the contact layers 108 thereon is about 2 μm.

The active layer 104 and the first cladding layer 103 are common to the respective light emitting regions A, B, but the second cladding layer 105 is thinned between the light emitting regions A, B, and the thickness of the thinned part of the second cladding layer 105 is 2000 Å. Between the contact layers 108 is formed the isolation well 111, which reaches the surface of the current blocking layer 106. The silcon nitride film 112 is formed to bury the groove 111 to thereby isolate the light emitting regions A B. Thinning the part of the second cladding layer 105 between the beams A, B can make electric crosstalks practically sufficiently small. The total removal of the part of the Upper cladding layer deteriorates oscillation characteristics of the light emitting regions A, B. It is important to sufficiently thin the part of the upper cladding layer (i.e. the second cladding layer 105) short of the total removal.

To realize a practical multi-beam semiconductor laser, it is necessary to suppress not only electric crosstalks, but also heat crosstalks. That is, since the semiconductor laser has the characteristic that as a temperature rises, an output decreases, it is necessary to suppress the adverse influence that by the heat generated by the drive of one of the light emitting regions, an output of the other decreases. Means which are considered to this end are 1) preventing heat from conducting between the light emitting regions, 2) making the light emitting regions unsusceptible to heat, 3) making the light emitting regions difficult to heat, and other means.

Next, the process for fabricating the multi-beam semiconductor laser will be explained with reference to FIGS. 2 and 3.

The first cladding layer 103, the active layer 104, the second cladding layer 105 and the cap layer 107 are epitaxially grown on the GaAs substrate 101 in the stated order, and then a silicon nitride film 121 is formed (FIG. 2A). The crystal growth temperature at this time is 740° C. The first cladding layer 103 is a n⁻ type conduction layer (impurity concentration: $2 \times 10^{17}$ cm$^{-3}$) and the second cladding layer 105 is a p⁻ type conduction layer (impurity concentration: $4 \times 10^{17}$ cm$^{-3}$), and the thickness of both cladding layers is 1 μm. The silicon nitride films 121 are patterned so as to be the mask for the etching of the parts indicated by the broken line in the next step. For this etching, the etchant is buffered hydrogen fluoride. The width of the two patterned silicon nitride films 121 is 5 μm, and the distance between the both films 121 is 15 μm. Correctly, the distance is a distance between the center of the films 121 corresponding to the light emitting region A and that of the films 121 corresponding to the light emitting region B.

Figure 2B:
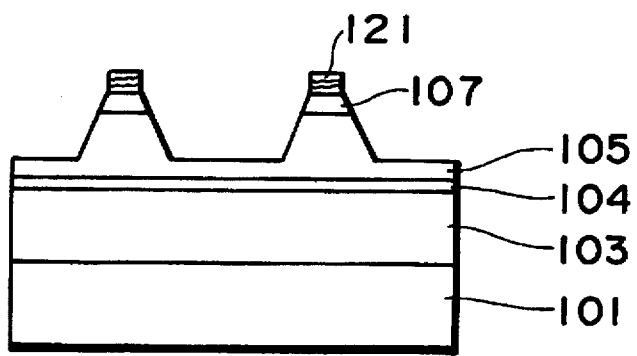
Figure 2C:
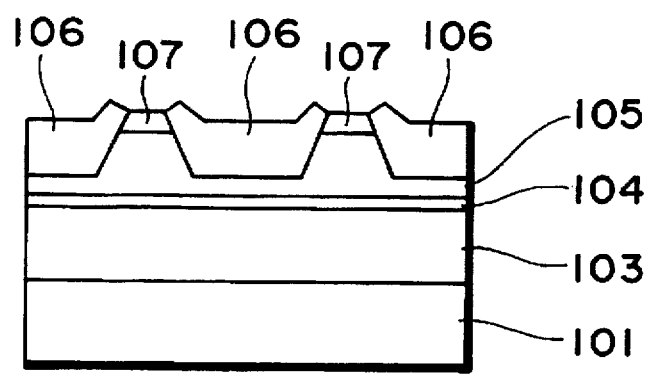
Figure 2D:
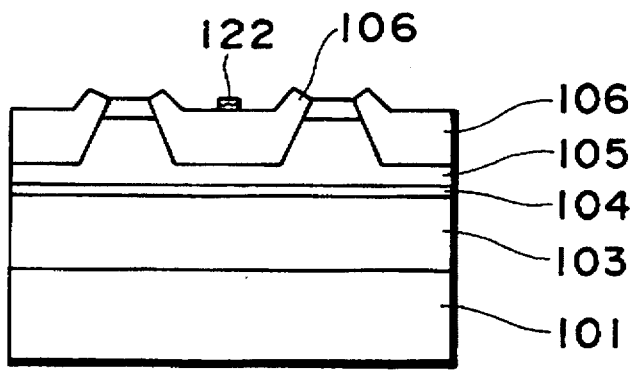

Then mesa-etching follows. The mesa etching was conducted on the second cladding layer 105 for 6 minutes using a mixed acid (sulfuric acid:hydrogen peroxide: water=3:1:1) of 50° C., and the second cladding layer 105 was left in a thickness of 2000 Å (FIG. 2B). Si-doped GaAs (impurity concentration: $2 \times 10^{17}$ cm$^{-3}$) is grown on the etched-off parts, and the current blocking layer 106 is formed. The silicon nitride films 121 are removed with an etchant (sulfuric acid:water=1:1) (FIG. 2C). Then a silicon nitride film is formed on the entire surface and then is subjected to a resist patterning and etching so that only the part of the silicon nitride film 122 between the light emitting regions A, B is left (FIG. 2D).

Figure 3A:
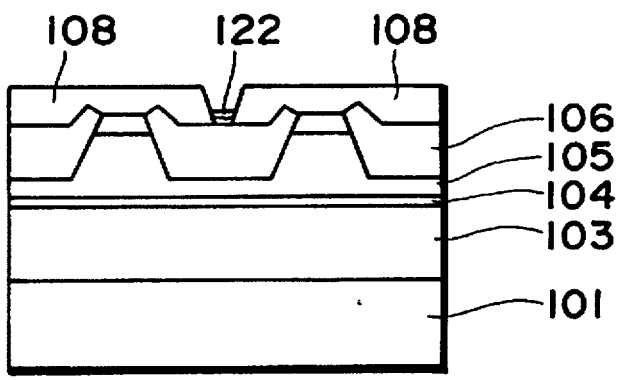
Figure 3B:
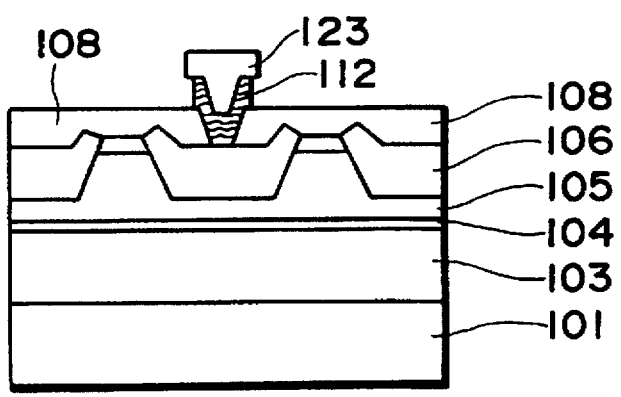
Figure 3C:
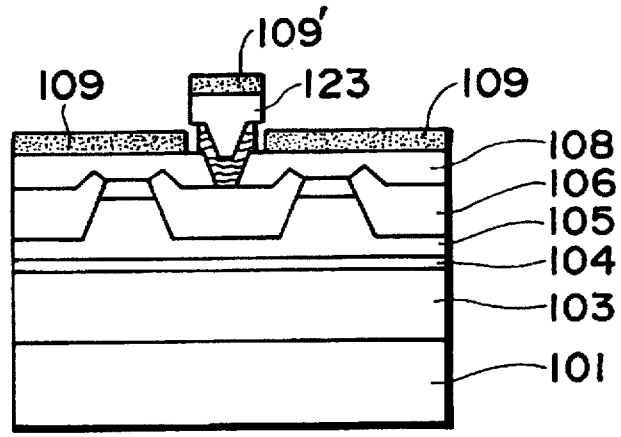

Then a Zn-doped GaAs film (impurity concentration: $1 \times 10^{19}$ cm$^{-3}$) is grown in a thickness of 1 μm, and contact layers 108 are formed spaced from each other by the part where the silicon nitride film 122 is left on (FIG. 3A). Then the left silicon nitride film 122 is removed, and another silicon nitride film (not shown) is formed on the entire surface. A resist pattern 123 is left on the part isolating the contact layers 108, and with the resist pattern 123 as the mask, the silicon nitride film (not shown) is etched off, and the patterned silicon nitride film 112 is left (FIG. 3B).

Figure 3D:
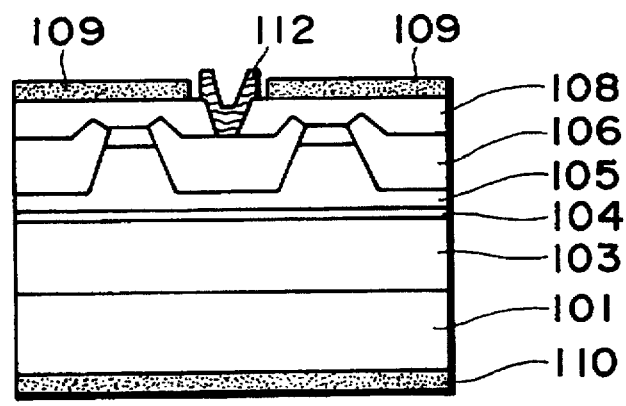

Subsequently, metal films 109 and 109' of three Ti/Pt/Au films are vaporized on the entire surface (FIG. 3C), and then the resist pattern 123 is removed with acetone to lift off the metal film 109', and p-electrodes 109 are left for the respective light emitting regions. Then the substrate is etched off from the underside into a thickness of about 70 μm. Subsequently an n-electrode is vaporized on the underside and alloyed for 1 minute at 400° C. in a nitrogen ambient atmosphere, and an n-electrode 110 of three films of AuGe/Ni/Au is formed (FIG. 3D).

Figure 4:
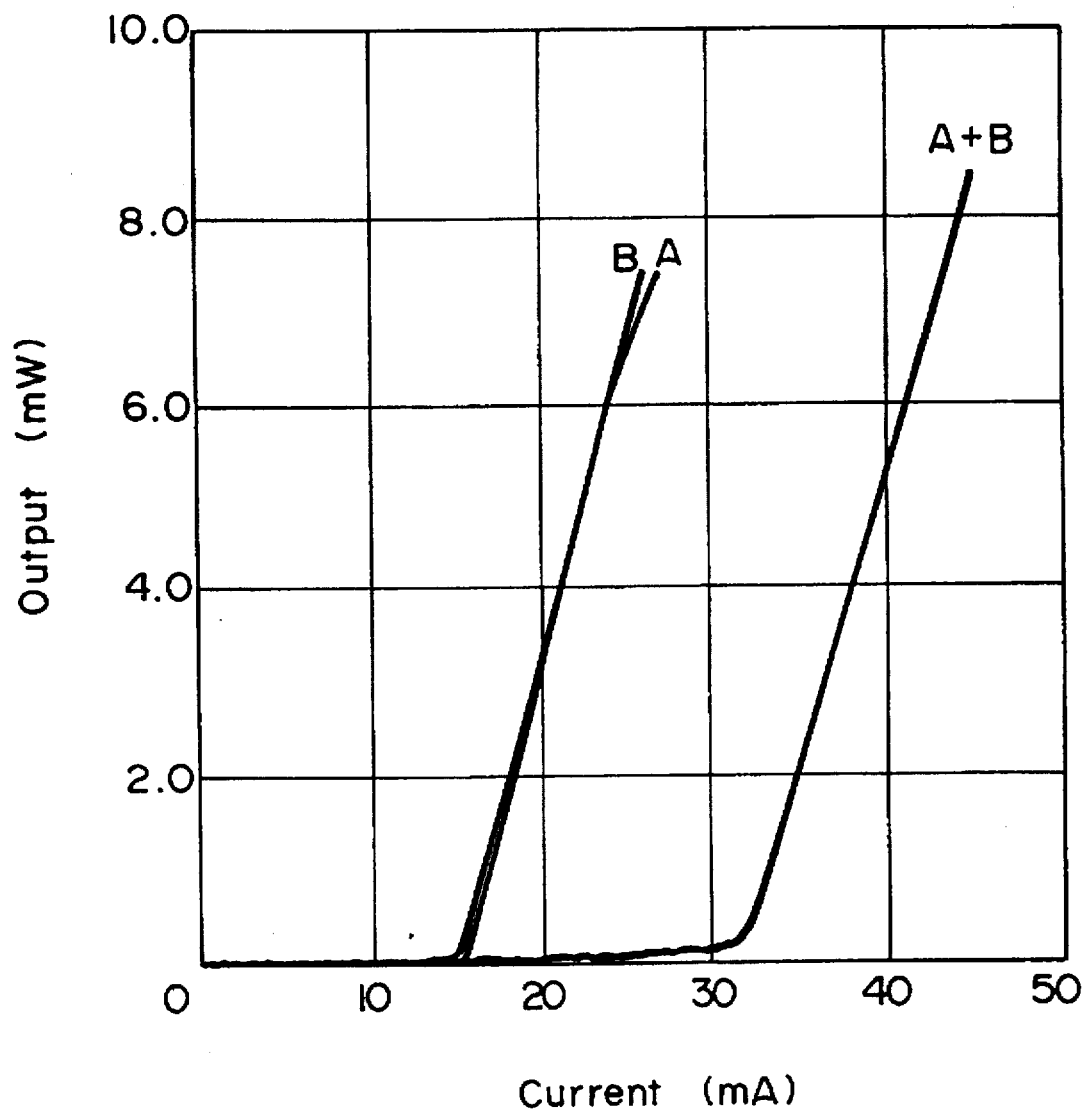
FIG. 4 is a graph of relationships between currents and beam outputs obtained when the multi-beam semiconductor laser of FIG. 1B is driven.

The thus-fabricated multi-beam semiconductor laser was cleaved into a chip having a 400 μm-width and an about 250 μm-resonator length, and two multi-beams, and was mounted with the epitaxially grown surface upward, with gold-20% tin solder. FIG. 4 shows current-light output characteristics of the respective beams of the thus-mounted multi-beam semiconductor laser. In FIG. 4 the solid lines A and B show the characteristics of the beams A and B when the respective beams are driven independently of each other, and the solid line C shows the characteristic obtained when the p-electrodes of both beams A and B, are shot-circuited. The threshold current is substantially twice that of the beams when they are driven independently. The near-field pattern when one of the beams was turned on was observed, and the other of the beams was found not emitting light. In addition; the resistance between the p-electrodes of both beams, i.e., the voltage-current characteristic, was checked. The resistance value was non-linear, and the resistance value decreased as the applied voltage decreases. In the range of trace voltages below 0.1 V, the resistance value was substantially constant and about 10 KΩ. That is, it is found that the semiconductor laser according to this embodiment constantly has a resistance value above 10 KΩ between the p-electrodes and has very small current crosstalks. With an inter-p-electrode resistance value above 1 KΩ, the respective beams can be driven independently of each other. In this embodiment the thickness d of the p-cladding layer (the second cladding layer) between the light emitting regions is 0.2 µm, but when the thickness d is 0.3 µm, the inter-p-electrode resistance is raised, and more current crosstalks were found. But the practical independent drive of the beams can be sufficiently secured.

In the following embodiments, the term "semiconductor laser" includes the semiconductor laser of FIG. 1B unless stated otherwise.

Embodiments of this invention will be explained with reference to the drawings.

The semiconductor laser according to a first embodiment of this invention will be explained.

Figure 5:
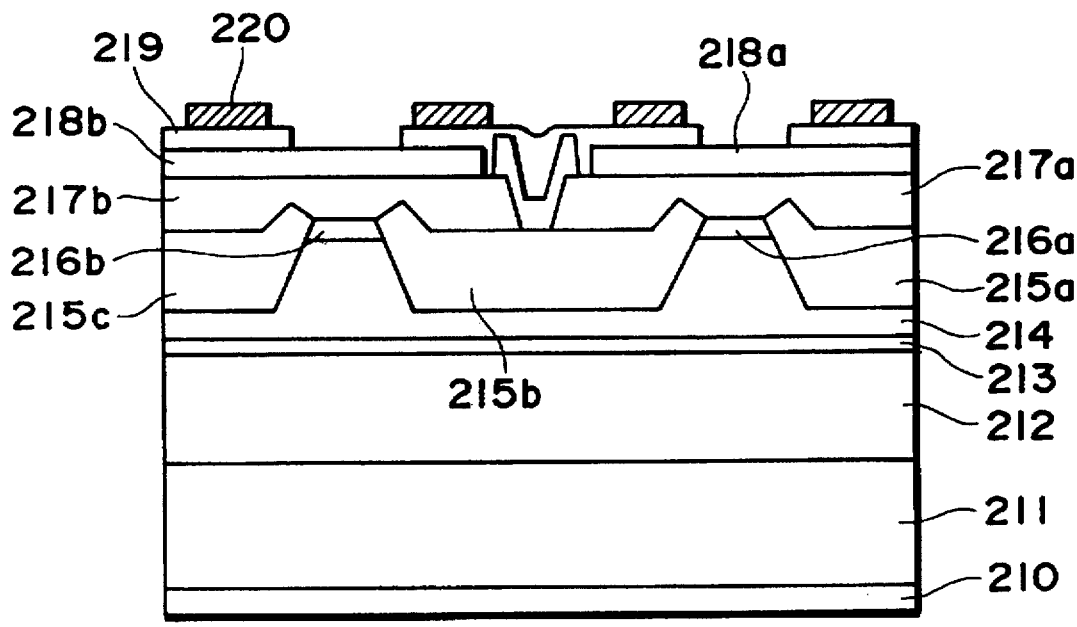
FIG. 5 is a sectional structural view of the multi-beam semiconductor laser according to one embodiment of this invention, which additionally includes heating means.

FIG. 5 is a sectional structural view of a first embodiment of the semiconductor laser of this invention. The semiconductor laser of this embodiment has a structure further comprising four resistors 220 through insulations 219 on the structure shown in FIG. 1B. This laser chip is fabricated by above-mentioned and known art.

When this laser resonators are driven, a current is cause to flow from current supply terminals 218a, 218b toward a common current supply terminal 210. Then carriers transit through contact layers 217a, 217b to a cladding layer 214 through gaps respectively between current block layers 215a, 215c, and a current block layer 215b. At this time, the carriers are caused to distribute due to an electric field in the shape of bemas from the cladding layer 214 to the common electrode 210, and a width of the carriers crossing the active layer 213 corresponds to a width of the associated stripe regions 216a, 216b formed of cap layers. Parts of the active layer 213 corresponding to this width oscillate, and respective laser beams are emitted. At the same time a set calories of oscillation heat is generated.

This embodiment is used as the light source of a laser printer. In this embodiment, the width of the stripe regions 216a, 216b is 4 µm, the interval between the centers of the stripe regions is 15 µm, and the length of the respective resonators toward a sheet is 250 µm.

This semiconductor laser includes heating means for generating pre-heat of substantially the same calorie as oscillation heat generated when the laser resonators are driven. Specifically, resistors 220 for generating heat proportional to a feed current are provided near the respective laser resonators through insulation films 219. It is preferable that a plurality of the resistors 220 are spaced from each other.

Next a method for driving the semiconductor according to this embodiment of this invention will be explained. When the light emitting regions as the light source are driven, first the heating means is actuated to give pre-heat to the laser resonators. After the laser resonators are driven, the heating means is stopped to decrease a calories of the pre-heat.

It is preferable that the pre-heat has substantially the same calories as the above-described generated heat, but may be below the generated heat. Specifically, when all of the two laser resonators are driven, the heating means may generate a calories for one laser beam so as to suppress the heat crosstalks due to the mutual influence of the heat generation of the laser beams. In this case, the heating means stops heating only while both laser resonators are being driven, and continues heating in other cases.

Thus, whether or not one and/or the other of the light emitting regions is driven the laser chip has a substantially constant temperature, and temperature changes before and after an actuation is suppressed. As a result, laser beams of uniform output levels can be supplied to he printing unit of a laser printer.

Figure 6:
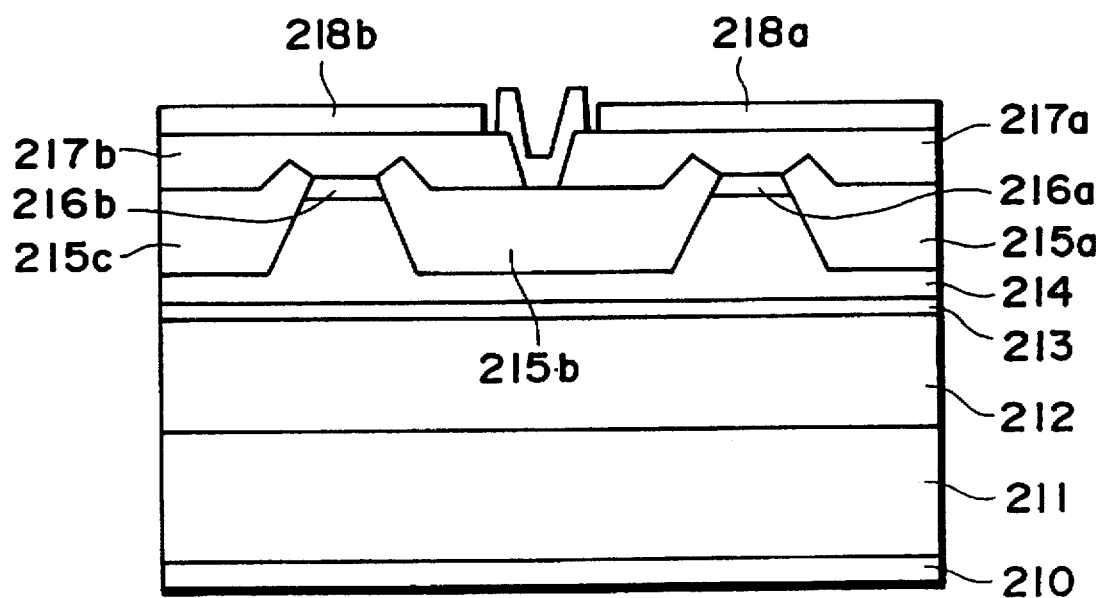
FIG. 6 is a sectional structural view of the multi-beam semiconductor laser according to one modification, which is driven a neighboring resonator as heating means.

Next, the first modification of the first embodiment will be explained. In this modification, the heating means is replaced by a laser resonator. Specifically, in the semiconductor laser of FIG. 6 which has the same structure shown in FIG. 1B, one of the laser resonators, and the other neighboring the former are alternately driven in accordance with a binary signal, and heat generated when either of the laser resonators is driven is supplied to the other of the laser resonators. Only the laser beams emitted from one of the laser resonators are used as the light source, and the laser beams from the other are shielded.

Figure 7:
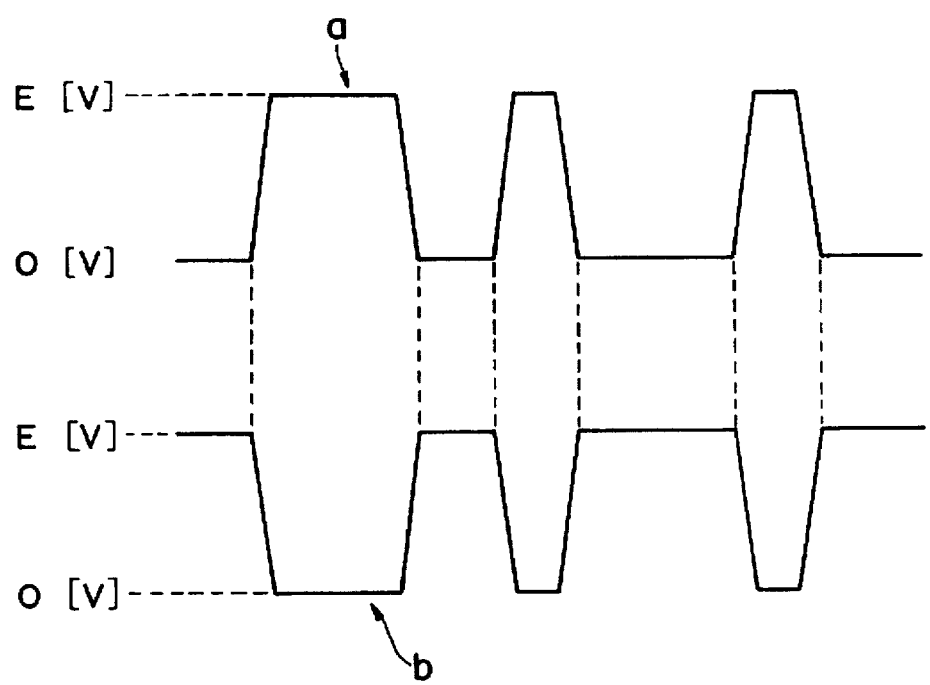
FIG. 7 is a view of drive timing of two laser resonators.

FIG. 7 is a drive timing chart of there respective laser resonators of the semiconductor laser according to the first modification. When it is assumed that the operating current for driving one of the laser resonators is as shown (a) in FIG. 7, the operating current is supplied to the other laser resonator at the timing of (b) in FIG. 7. That is, a timing is so set that a voltage E[V] is supplied alternately to the laser resonators to make a total of the operating currents of both laser resonators constant.

Such operation can retain a temperature of the laser chip always constant without the additional provision of the heating means in the semiconductor as shown in FIG. 5. Even if there is a time in which an operating current flows concurrently through both laser resonators, no trouble occurs in most applications of the semiconductors as long as the time is below about 100 ns.

The semiconductor laser of the second modification according to the first embodiment will be explained. This modification is an improvement of the first modification. The influence of the laser beams from one of the laser resonators which is used as the heating means is lessened.

FIG. 8 is a sectional structural view of the second modification. This modification includes four laser resonators. This semiconductor laser is fabricated by the known art, as are done the first embodiment and the first modification respectively shown in FIGS. 5 and 6.

In this example, the second stripe region 236b and the third stripe region 236c at the center have a width of 4 µm, the first stripe region 236a and the fourth stripe region 236d have a width of 80 µm. All the stripe regions are spaced from each other by 11 µm. A length of the respective laser resonators toward a sheet is 250 µM.

In this case that only a protection film is provided on the end surface for no changing a reflectance, a threshold current necessary to oscillate a laser beam of 6 mW from one of the 4 μm-width laser resonator is about 30 mA. At this current, the 80 μm-width oscillation regions emit no laser beams. By making use of this characteristic, the 80 μm-width stripe regions 236a, 236d (hereinafter called the first laser resonator and the fourth laser resonator) are used as heating means for giving pre-heat to the 4 μm-width stripe regions 236b, 236c (hereinafter called the second laser resonator and the third laser resonator).

That is, the second and/or the third laser resonator, and the first and/or the fourth laser resonator are supplied alternately with an operating current which does not exceed a threshold current of the latter. At this time, the latter laser resonators generates pre-heat to be fed to the former laser resonators, but the laser beams emitted from the former laser resonators have such a low output level that it is not practically necessary to shield the laser beams.

The drive regions of the first and the fourth laser resonators are short-circuited to provide a common drive region, and a total of operating currents supplied to the respective drive regions of the second and the third laser resonators, and the common drive region is made constant, whereby a temperature of the laser chip can be retained always substantially constant. Furthermore, the current supply to the common drive region is stopped only when he second and the third laser resonators are concurrently supplied with a current, and in the other cases, the operating current as that supplied when the second and the third laser resonators are driven is supplied, whereby power consumption can be decreased.

The third modification of the first embodiment will be explained. In this modification, the laser beams of one of the laser resonators which is alternately drive according to the first modification are not shielded but positively used.

Specifically, the semiconductor laser according to the first modification is applied as the signal light source of optical communication. The respective laser beams are incident on signal transmission lines such as optical fibers or others. Since the laser resonators are alternately driven, the respective laser beams contain the same information. The photodetecting side detects the information transmitted by the respective optical fibers and compares the identity of both information. Resultantly optical communication systems of higher redundancy and safety can be provided.

In such optical communication systems, the semiconductor laser may be adapted to emit laser beams of a plurality of wavelengths, and the laser beams are detected in accordance with wavelengths, whereby the systems can have higher precision.

Figure 9:
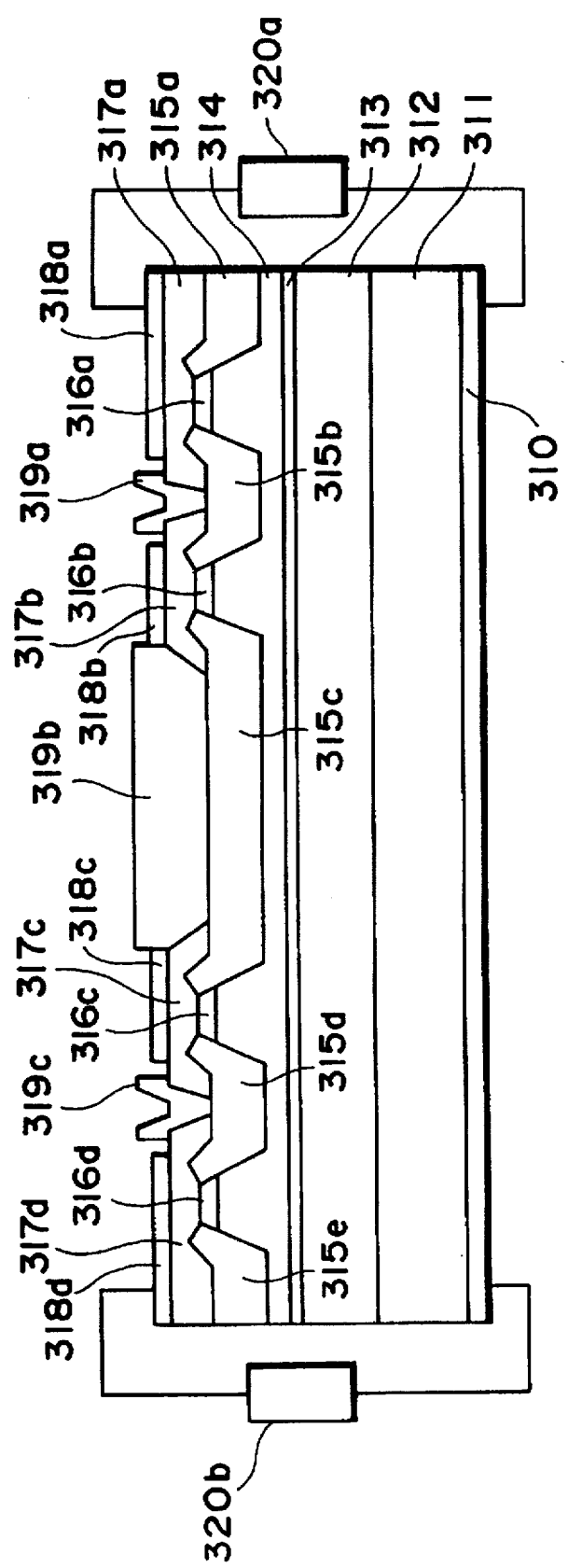
FIG. 9 is a sectional structural view of the semiconductor laser according to one embodiment of this invention, which can confirm lifetimes of the semiconductor laser.

FIG. 9 is a sectional structural view of the semiconductor laser according to a second embodiment of this invention. This semiconductor laser is a multi-beam semiconductor laser including four light emitting regions which are independently driven of each other. A first cladding layer 312 of Se-doped AlGaInP and an active layer 313 are formed on a Si-doped GaAs substrate 311 in this order, and then a second cladding layer 314 of Zn-doped AlGaInP is formed on the active layer 313. The second cladding layer 314 has two mesa (projecting) portions which correspond to emission regions, and is so designed as to physically continuously cover the active layer 313. Four stripe regions 316a~316d made of cap layers of Zn-GaInP is further formed on the flat top portion of each of the mesa portions.

In addition, current block layers 315a~315e Si-doped GaAs are formed on the second cladding layer 314 excluding those areas on which the stripe regions 316a~316d (cap layers) are formed. That is, the current block layers 315a~315e are so formed as to be embedded between the two mesa portions (containing the both sides of the mesa portions) each comprising the stripe regions 316a~316d (cap layers) and the second cladding layer 314.

In addition, contact layers 317a~317d of Zn-doped GaAs are formed on the stripe regions 316a~316d (cap layers) and the current block layers 315a~315e. And silicon nitride films 319a~319c, structurally separating the contact layers 317a~317d, are formed on the surface of the central portion of the current block layers 315a~315d through which the four emission regions are separated from each other. That is, the silicon nitride films 319a~319c are formed to bury three isolation grooves formed between four light emitting regions.

Current supply terminals 318a~318d are formed on each of the four separated contact layers 317a~317d, and a common current supply terminal 310 is formed on the back surface of the GaAs substrate 311. This semiconductor laser is fabricated by known process using epitaxial growth, etching, etc.

As shown in FIG. 9, the semiconductor laser according to this embodiment includes two pairs of laser resonators having as the oscillation regions the active layer 313 sandwiched by the cladding layer 312, 314. A first current supply terminal 318a and a fourth current supply terminal 318d of the respective pairs of laser resonators are used as monitor terminals and connected to the common current supply terminal 310 respectively through shunt resistors 320a, 320b of about 10 ohms.

In this embodiment, the respective stripe regions 316a~316d are spaced from each other by 4 μm. The interval between the first and the second stripe regions 316aa, 316b, and that between the third and the fourth stripe regions 316c, 316d are respectively 7 μm. The interval between the send the third stripe regions 316b, 316c is 15 μm. The laser resonators having the oscillation regions associated with the first to the fourth stripe regions 316a~316d are hereinafter called the first to the fourth laser. resonators.

When current is caused to flow from their current supply terminals 318c, 318d toward the common current supply terminal 310 to drive the second and the third laser resonators, carriers which have passed through the contact layers 317b, 317c transit to the cladding layer 314 through the gaps between the current blocking layer 315c, and the current blocking layers 315b and 315d respectively. At this time, the carriers have, due to an electric field, beam-like distributions from the cladding layer 314 to the common electrode 310. Width of the distributions in active layer 313 correspond to widths of the associated stripe regions 316b, 316c. Parts of the active layer 313 corresponding to these widths oscillate to respectively emit laser beams.

At this time, the first and the fourth laser resonators are not in drive, but the laser beams leak through the active layer. Resultantly electromotive forces are generated due to the light interference between the current supply terminals of the first laser resonator and of the fourth laser resonator. The voltages of these electromotive forces are constant independent of intensities of the emitted laser beams, but are passed through the shunt resistors 320a, 320b and decrease their voltages. The electromotive forces can be a function of the intensities of the laser beams. Accordingly by measuring these voltages by the first and the fourth laser resonators, states of the second and the third laser resonators can be monitored. Relationships among the shunt resistors, the voltage and the output level of the laser beams differ depending on structures of semiconductor lasers. Values of the shunt resistors 320a, 320b are determined in accordance with structures of the used semiconductor laser.

When the second and the third laser resonators are not in drive, a reference current of, e.g., 1 mA is supplied to the current supply terminals 318a, 318b of the first and the fourth laser resonators, and the inter-terminal voltage at this time is measured so as to monitor a current temperature of the laser chip. That is, when the reference current is supplied, $$\underset{\text{the laser chip}}{(\text{A resistance of})} \times (\text{A reference current}) = (\text{An inter-terminal voltage})$$

holds. Since a resistance value of the laser chip is expressed by a function of the laser chip temperature, a resistance value at the reference temperature, and a measured resistance value are compared to thereby compute indirectly a current temperature of the laser chip. Based on this temperature, a total state of the semiconductor laser can be monitored.

In this embodiment, the first and the fourth laser resonators are used as a monitor, but in the case that the second the third laser resonator cannot be sufficiently spaced from each other, the current supply terminals 318a, 318c of the latter are connected to the shunt resistors 320a, 320b for the monitoring. Resultantly the light interference between the neighboring laser resonators does not occur, and detection precision is increased.

This embodiment includes two pairs of laser resonators in the laser chip. But the semiconductor laser including only one pair of laser resonators, or three or more pairs of laser resonators can produced the same effects.

As described above, according to the second embodiment of this invention, a plurality of pairs of laser resonators are included in the laser chip, and one pair of laser resonators is photo-interfered with the other pair of laser resonators. The current supply terminals of one pair are electrically connected through the shunt resistors. The semiconductor laser can have also the function of monitoring its laser beams by itself. As a result, even in the case that oscillation points are not much spaced, the use of the semiconductor laser for the monitor facilitates the monitor of output levels of the respective laser beams with accuracy.

In this embodiment, in the case that two pairs of laser resonators are provided, the current supply terminals of one pair of laser resonators are electrically connected through the shunt resistors. As a result, the light interference between the laser resonators of the other pair can be hindered. The monitor can be more accurate. The use of the semiconductor laser according to this embodiment enables the simple monitor of the laser chip temperature.

Figure 10:
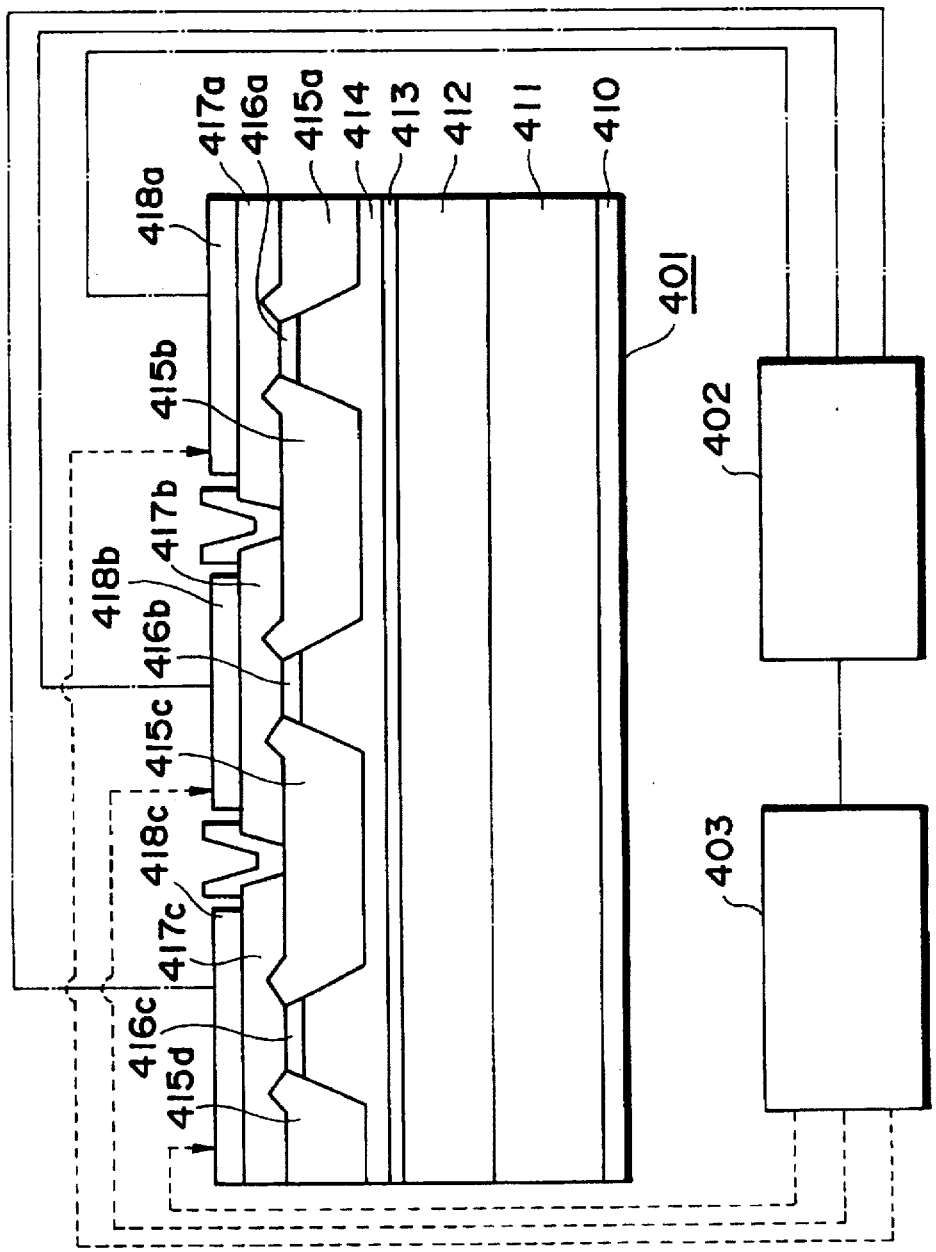
FIG. 10 is a view of the semiconductor laser according to one embodiment, which can detect deterioration of the semiconductor laser and switch a drive to another laser resonator.

FIG. 10 shows a structural view of the semiconductor laser according to a third embodiment of this invention. The multi-beam semiconductor laser 401 according to this invention includes three laser resonators having as the oscillation regions an active layer 413 sandwiched by cladding layers 412, 414. This multi-beam semiconductor laser 401 is packaged when used.

When current is caused to flow from their current supply terminals 418b, 418d toward the common current supply terminal 410 to drive the resonators, carriers which have passed through contact layers 417b, 417c transit to the cladding layer 414 through the gaps between current blocking layer 415c, and the current blocking layers 415b and 415d respectively. At this time, the carriers have, due to an electric field, beam-like distributions from the cladding layer 414 to the common electrode 410. Width of the distributions in active layer 413 correspond to widths of associated stripe regions 416b, 416c. Parts of the active layer 413 corresponding to these widths oscillate to respectively emit laser beams. The beam interval between these laser beams is 15 μm.

The semiconductor laser 401 according to this embodiment having the above-described structure, the laser resonator including the first stripe region 416a is appropriated to the current use, the laser resonators including the second and the third stripe regions 416b, 416c are respectively appropriated to spare laser resonators, and the beams emitted from the current-use laser resonator are used as a light source of a laser printer.

Deterioration detecting means 402 detects deterioration of the current-use laser resonator of the semiconductor laser 410 and includes an electromotive force detecting circuit for detecting an electromotive force generated in a neighboring spare laser resonator. In the semiconductor laser 401 as shown in FIG. 10 having a structure in which a plurality of laser resonators are optically tightly coupled, an undriven laser resonator neighboring a driven laser resonator serves as a photo-diode. Accordingly, by detecting an electromotive force of the resonator, an output of a laser beam of the driven laser resonator can be known. In this case, a voltage generated in the active layer of the driven laser resonator is constant irrespective of laser beam intensities, but by shunting the voltage by a suitable resistor, a voltage drop takes place in the cladding layers and others of the spare laser resonator. A voltage generated between the current supply terminals is a function of an intensity of a driven beam. Accordingly when an electromotive force drops below a preset allowable range, a lifetime of the current-use laser resonator is judged to have expired, and a command signal is outputted to drive switching means 403 which will be described.

The deterioration detecting means 402 includes also a voltage detecting circuit for detecting a voltage available when a reference current is supplied to the undriven spare laser resonator. This is based on the fact that a heat resistance of the spare laser resonator rises under the influence of the heat generated in the laser resonator in drive. That is, a voltage available when a reference current is supplied is measured, and a resistance value at this time is detected, whereby a heat increase of the laser chip can be indirectly detected. This facilitates the synthetic judgement as to whether a decrease of an output level of the laser resonator n drive is due to its lifetime or the generated heat. Accordingly situations in which command signals are erroneously outputted can be prevented This embodiment includes two laser resonators in the laser chip. But another semiconductor laser which is not only the above-mentioned laser chip, for example, which includes three or more laser resonators, can produced the same effects.

In this laser system, this deterioration detecting means 402 can be provided by a usual photo-diode separated from the multi-beam semiconductor laser chip. In this case, a photo-diode is disposed in a package of the semiconductor laser to measure as required a drooping ratio of the current-use laser resonator. The deterioration detecting means 402 judges the expiration of a lifetime of the current-use laser resonator, e.g., when a measured drooping ratio is about 80% of a initial drooping ration, and outputs a set binary signal to the drive switching means 403.

This laser system may have an auto power control unit (APC unit) which controls current to keep an intensity of the laser beam constant. In this case, the APC unit detects the deterioration by measuring the current substituted for measuring the intensity of the laser beam. So, in this invention, the detecting the deterioration based on the intensity of the laser beam includes the detecting the deterioration based on the current or on the voltage.

The drive switching means 403 stops the drive of the current-use laser resonator in response to a command signal outputted by the deterioration detecting means 402, and switches to drive a rest spare laser resonator in a preset order of precedence as the current use laser resonator. Specifically, in FIG. 10, the laser resonator including the second stripe region 416b is used as the current-use laser resonator. The drive switching means 403 uses the operating current switching circuit for supplying a power to the driving regions of the respective laser resonators, so as to switch the drive while the deteriorated current-use laser resonator is not emitting bemas.

A position of a laser beam is spaced from that of the previous laser beam by about 15 μm. But the optical system is so arranged that an about 30 μm-displacement of a semiconductor laser mounting position can be adjusted, whereby the current-use laser resonator-to-a spare laser resonator switch can be enabled. Furthermore, when the replacing laser resonator is deteriorated, this laser resonator is switched to a rest laser resonator is switched to a rest spare laser resonator. When this rest spare laser resonator is deteriorated, a lifetime of the semiconductor laser has expired.

As described above, since the semiconductor laser 401 itself has pare laser resonators built in, the structure of the semiconductor laser can be simplified. In addition, laser beams can be emitted stably for a long period of time. As result, the use of the semiconductor laser according to this embodiment as light sources makes laser printers inexpensive, and raises their operational reliability in comparison with the conventional laser printers.

In this embodiment the semiconductor laser includes three laser resonators. But this embodiment can be realized by including current-use laser resonator and spare laser resonators, and numbers of the current-use and the spare laser resonators are not essentially limited to the above-described numbers. The semiconductor laser according to this invention is applicable to optical information processing systems and optical communication systems. In this embodiment, the spare laser resonators are used as back-ups and the monitor (sensor) for the current-use laser resonator, but may be used only as the monitor.

Figure 11:
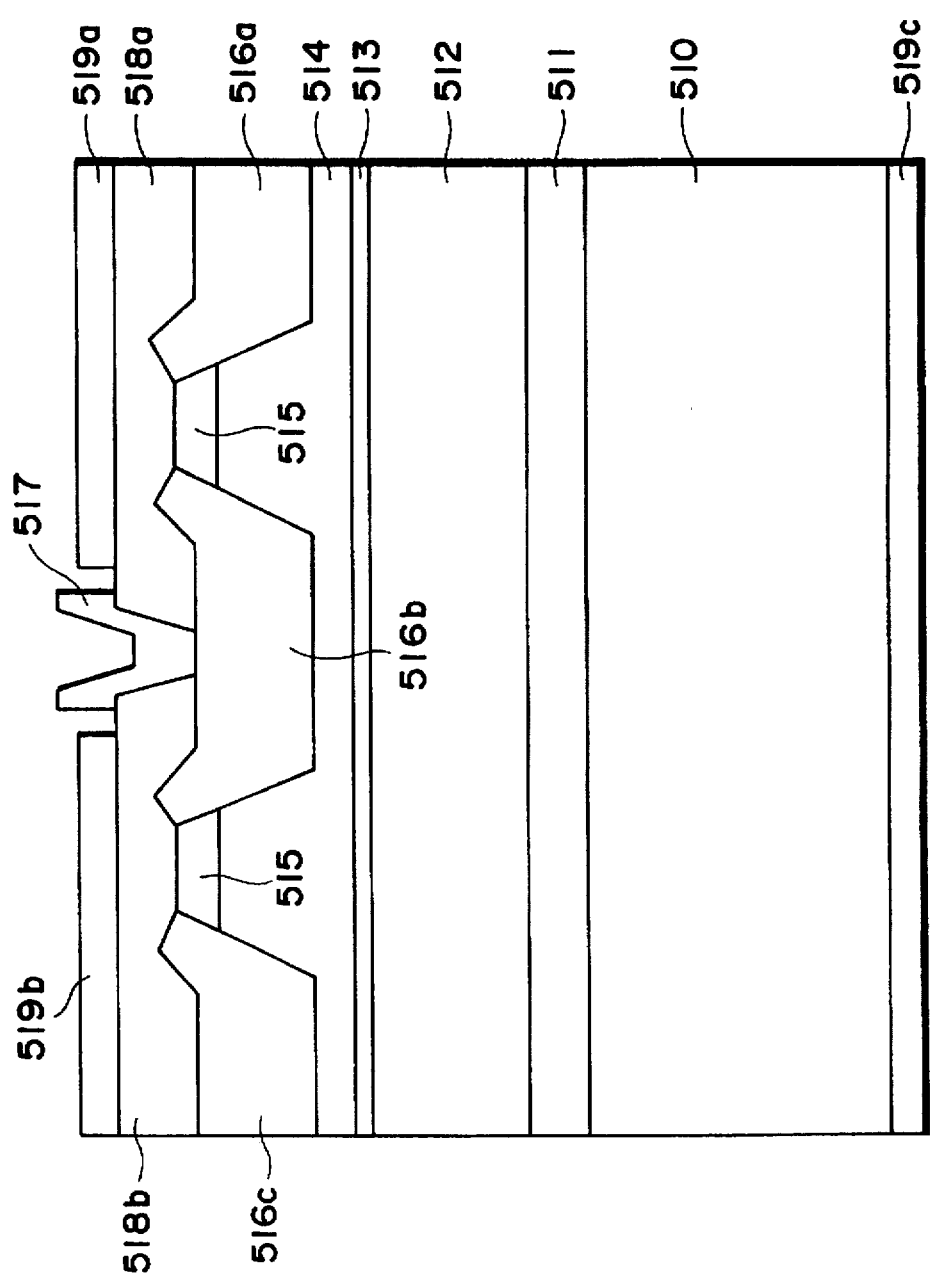
FIG. 11 is a Sectional structural view of the semiconductor laser according to one embodiment, which can suppress heat crosstalks.

The semiconductor laser according to a first example of a fourth embodiment of this invention has the structure of FIG. 11, and a first cladding layer 512 is formed of n-AlGaInP mixed crystal, and a second cladding layer 514 is formed of p-AlGaInP mixed crystal.

One means for suppressing heat crosstalks of multi-beam semiconductor lasers is to improve heat radiation of the laser chips to suppress temperature rises of the laser chips due to their heating. From this viewpoint, it appears disadvantageous to use AlGaInP mixed crystal having a heat resistance some times that of the conventional AlGaAs mixed crystal. But based on studies of the inventors, it is found that higher heat resistances of the cladding layers are rather more advantageous.

Figure 12:
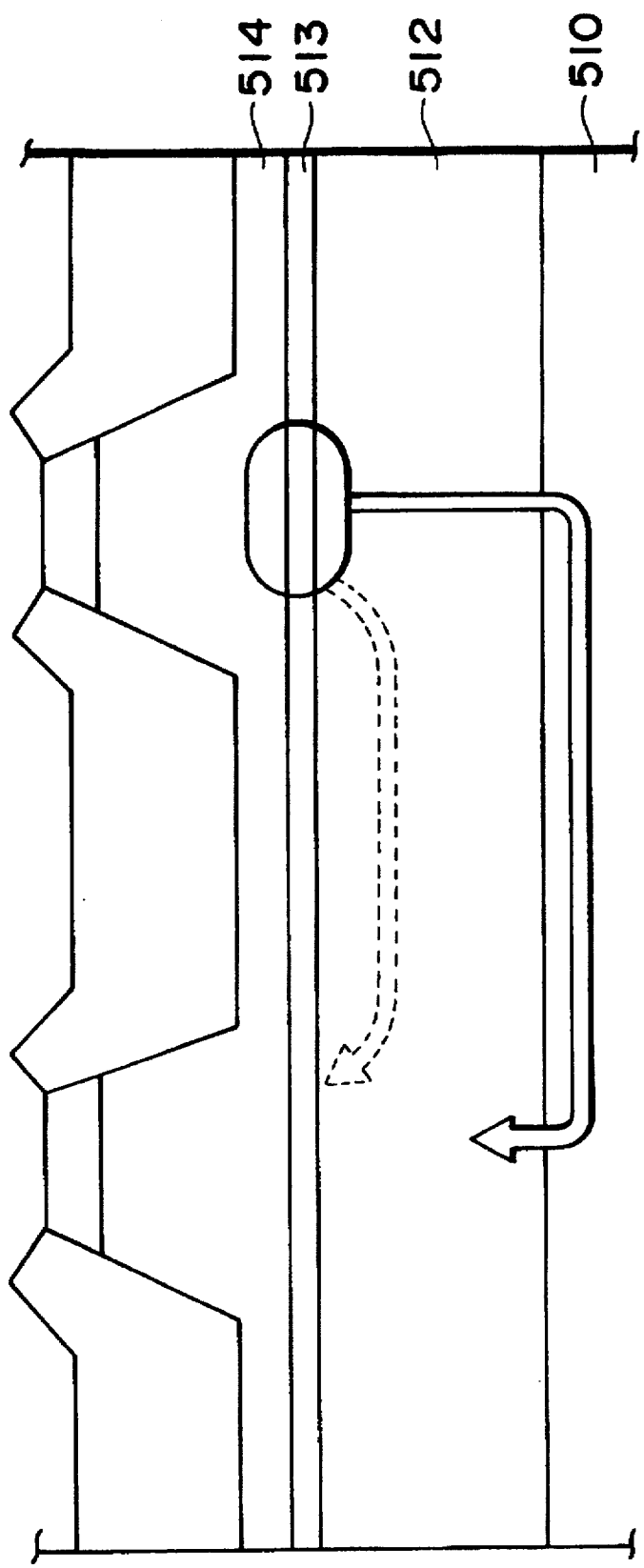
FIG. 12 is a view explaining the suppression of heat crosstalks.

As shown in FIG. 12, the heat generated when one laser resonator is driven is conducted from the first cladding layer 512 of AlGaInP mixed crystal toward the GaAs substrate 510 of a lower heat resistance and then toward another laser resonator along the substrate 510. The heat is conducted along the so-called detour. The conventional multi-beam semiconductor lasers including the cladding layer 512 of AlGaAs mixed crystal also has this tendency, but as indicated by the broken line in FIG. 12, has a shorter conduction path than the multi-beam semiconductor lasers including the cladding layer 512 of AlGaInP mixed crystal. This is because both semiconductor lasers have different heat resistance ratios with respect to the GaAs substrate 510.

For example, in the case that the cladding layers 512, 514 are formed of $(Al_{0.6}Ga_{0.3})_{0.5}In_{0.5}P$ mixed crystal, their heat resistance, although not accurately known, is about 17 Kcm/W (Hatakoshi, et al., The Transactions of the IEICE, Vol. E71, No. 4, 1988, Ps. 315–317), which is twice that of $Al_{0.6}Ga_{0.4}As$ (8.8 Kcm/W) and 7 times that of GaAs crystal (2.3 Kcm/W) of the semiconductor substrate 510. The heat resistances of AlGaAs and GaAs were computed based on the data presented by Nakwaski, Journal of Applied Physics, Vol. 64, 1988, Ps. 159–166.

Thus, the higher is the heat resistance ratio of the cladding layers to the GaAs substrate 510, the longer is the heat conduction path, and the heat crosstalks are accordingly decreased. This has been the case with the cladding layers 512, 514 of AlGaInP mixed crystal, but the same effect can be produced also in the cases that the cladding layers 512, 514 are formed of GaInP mixed crystal or AlInP mixed crystal, that the cladding layers 512, 514 are formed of GaInP or AlInP mixed crystal, and that the cladding layers 512, 514 are formed of a mixed crystal of GaInP, AlGaInP or AlInP.

Such layer structure can be used not only in cases that the active layers 513 is formed of GaAs crystal or AlGaAs mixed crystal as has been conventionally done, but also in cases that the active layer 513 is formed of InGaAs mixed crystal, GaInP mixed crystal, AlGaInP mixed crystal or others. Especially in the case that the active layer 513 is formed of GaAs crystal, AlGaAs mixed crystal or InGaAs mixed crystal, the first and the second cladding layers 512, 514 is formed of AlGaInP mixed crystal, whereby very efficiently a band gap difference between the two can be made larger than in the case that the cladding layers 512, 514 are formed of AlGaAs mixed crystal.

In the above-described structure, since the current block layers 16a~16c are formed of n-GaAs crystal, the heat can be conducted easily to some extent, but a multi-beam semiconductor laser having less heat crosstalks than the conventional multi-beam semiconductor laser can be fabricated. This is especially effective in the case that the interval between the respective stripes is as small as below 50 μm, and the usual structures make the heat crosstalks larger.

Figure 13:
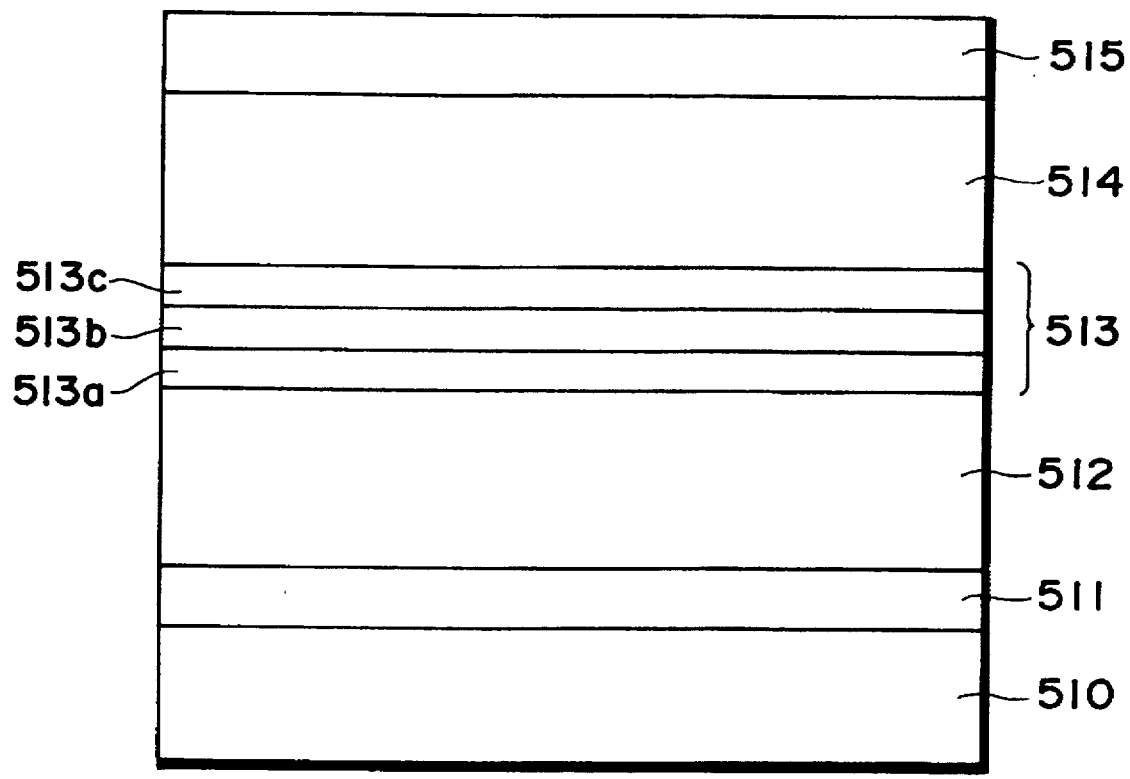
FIG. 13 is a sectional structural view of epitaxially grown layer of a mixed crystal.

FIG. 13 is a sectional structural view of the epitaxially grown layers as the laser starting material of the multi-beam semiconductor laser according to this embodiment. In FIG. 3, by known crystal growing technique, such as OMVPE (Organometallic Vapor Phase Epitaxy) or others, a buffer layer 511 of a 0.23 μm-thickness, a first cladding layer 512 of a 1.1 μm-thickness, an active layer region 513 comprising a light confining layer 513a, an active layer 513b and a light confining layer 513c, respectively of a 0.04 μm-thickness, a second cladding layer 514 of a 1.2 μm-thickness and a cap layer 515 of a thickness of 0.14 μm-thickness are formed on the upper surface of a semiconductor substrate 510 in the stated order.

The semiconductor substrate 510 is formed of Si-doped GaAs mixed crystal having an electron concentration of $2 \times 10^{18}$ cm$^{-3}$; the buffer layer 511 is formed of Si-doped GaAs mixed crystal of an electron concentration of $1.5 \times 10^{18}$ cm$^{-3}$; the first cladding layer 512 is formed of Se-doped $(Al_{0.7}Ga_{0.3})_{0.5}In_{0.5}P$ mixed crystal of an electron concentration of $2\times10^{17}$ cm$^{-3}$; in the active layer region 513 the light confining layers 513a, 513c are formed of an undoped $Ga_{0.5}In_{0.5}P$ mixed crystal, and the active layer 513b is a well layer of GaAs mixed crystal; the second cladding layer 514 is formed of a Zn-doped $(Al_{0.7}Ga_{0.3})_{0.5}In_{0.5}P$ mixed crystal of a hole concentration of $4\times10^{17}$ cm$^{-3}$; and the cap layer 515 is formed of Zn-doped $Ga_{0.5}In_{0.5}P$ mixed crystal of a hole concentration of $1\times10^{18}$ cm$^{-3}$.

FIGS. 14 to 16 show the steps of a process for fabricating the multi-beam (double beam) semiconductor laser of this embodiment of this invention. Each step will be explained with reference to FIGS. 14A to 16D.

Figure 14A:
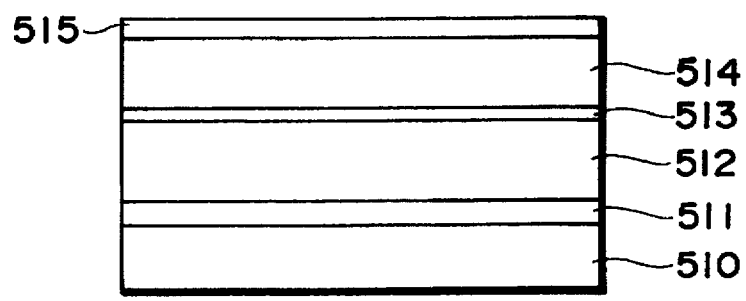
FIGS. 14A to 14D, 15A to 15D and 16A to 16D are sectional view Of the steps of fabricating the semiconductor laser according to the embodiment of FIG. 11, which can suppress heat crosstalks.
Figure 14B:
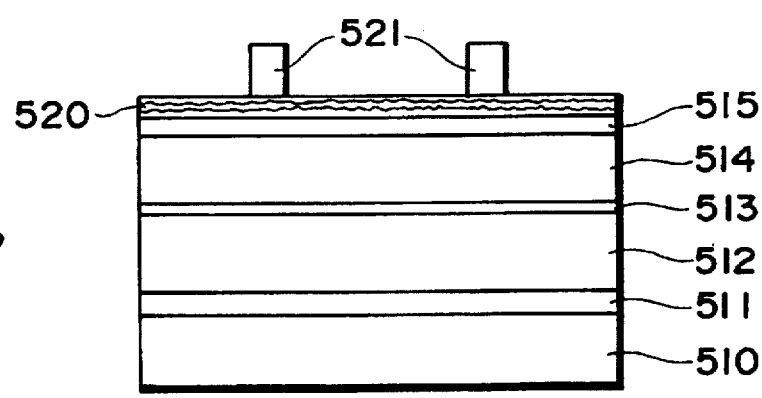
Figure 14C:
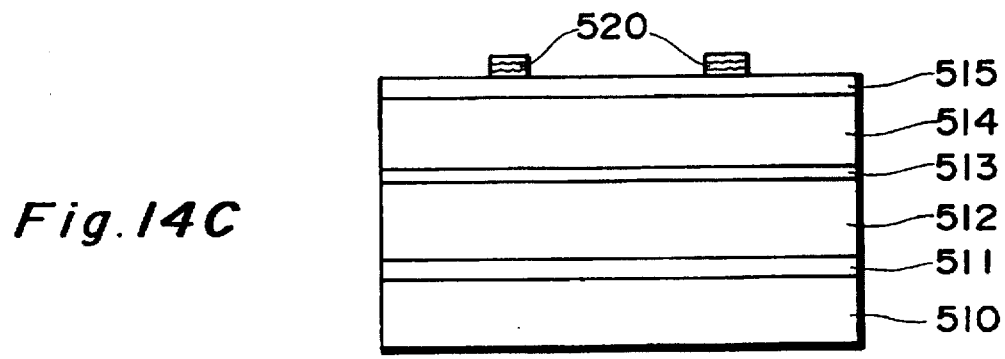
Figure 14D:
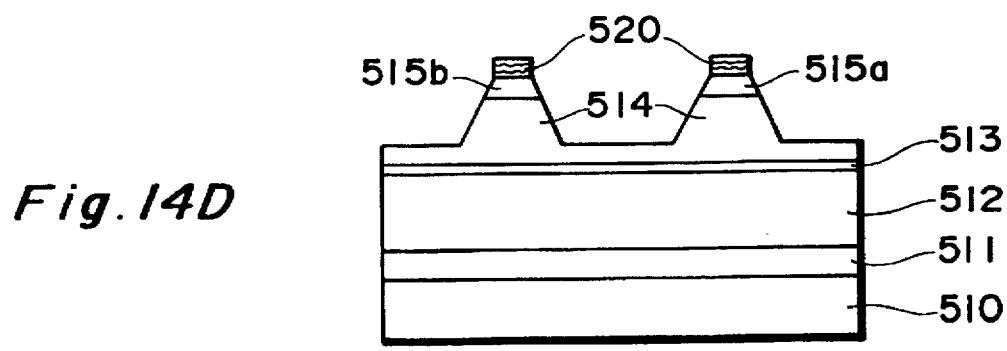

First with the epitaxially grown layers of FIG. 13 as a laser starting material (FIG. 14A), a nitride film 520 is formed on the upper surface of the cap layer 515 and then patterned using a resist 521 (FIG. 14B). Next, the part of the nitride film 520 which is not covered with the resist 521 is etched off by, e.g., buffered hydrogen fluoride, and then the resist 521 is removed with acetone (FIG. 14C). The nitride film 520 is etched for 6 minutes with a 50° C. mixed acid (sulfuric acid:hydrogen peroxide:water=3:1:1) to leave the second cladding layer 514 in a about 0.2 μm-thickness (FIG. 14D). Thus, two stripe regions 515a, 515b are formed of the cap layer.

Figure 15A:
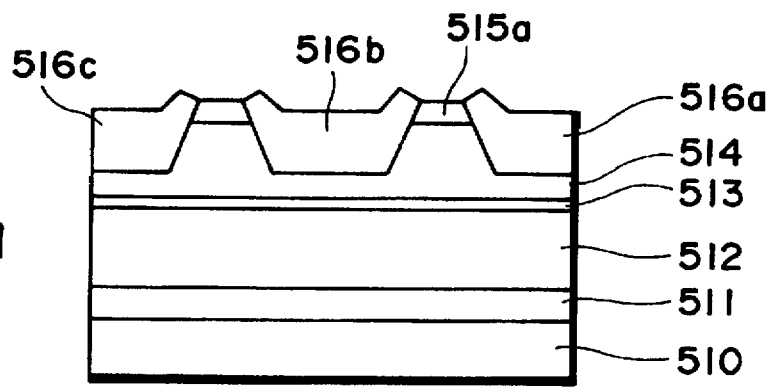
Figure 15B:
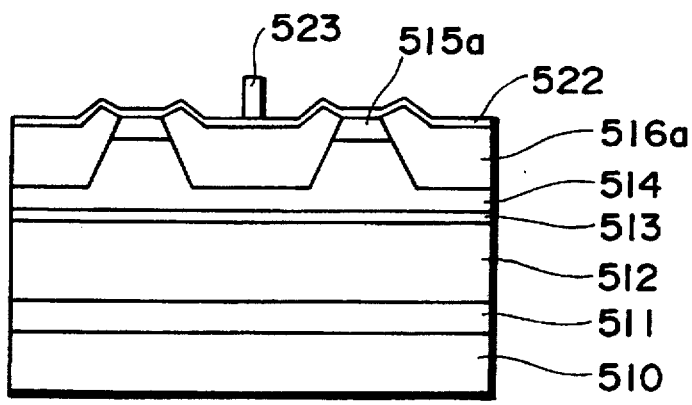
Figure 15C:
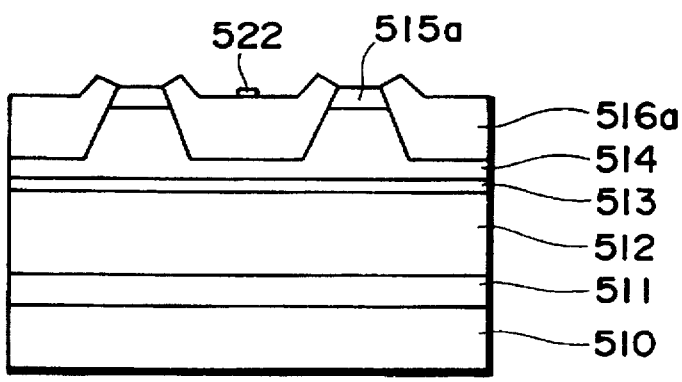
Figure 15D:
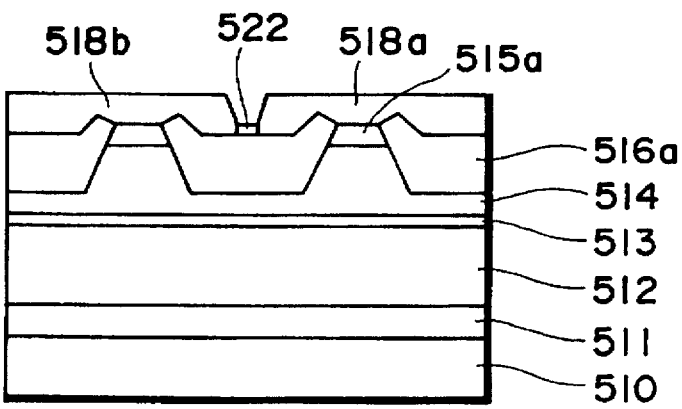

Subsequently Si-doped GaAs (electron concentration: $2\times10^{17}$ cm$^{-3}$) is grown in a thickness of 0.3 μm, and then the remaining nitride film 520 is etched with a mixture of hydrogen fluoride and water (1:1). Thus, the current blocking layers 516a~516c are formed (FIG. 15A). A nitride film 522 is formed on the surfaces of the current blocking layers 516a~516c and of the stripe regions, and a resist is positioned at the central part thereof (FIG. 15B). The part of the nitride film 523 except the central part where the resist is positioned is etched (FIG. 15C). Zn-doped GaAs (hole concentration: $4\times10^{17}$ cm$^{-3}$) on the surface of the left nitride film in a thickness of 1 μm. Thus the contact layers 518a, 518b are formed (FIG. 15D).

Figure 16A:
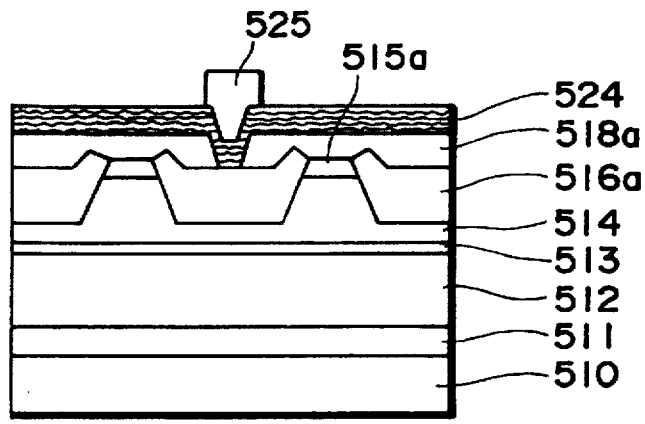
Figure 16B:
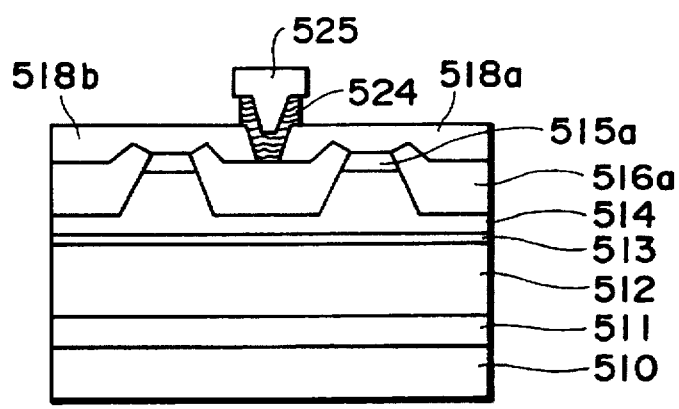
Figure 16C:
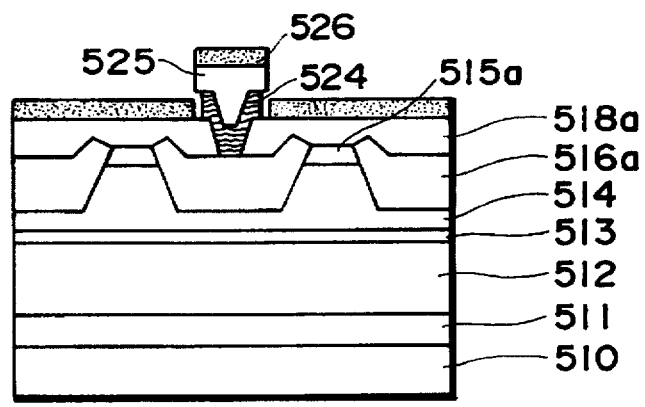
Figure 16D:
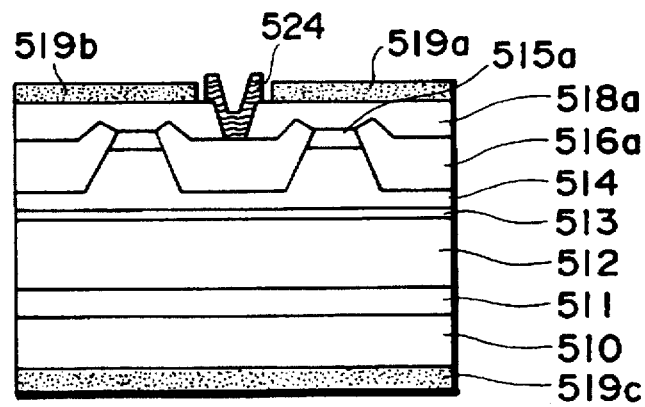

The part of the nitride film 522 at the central part is removed, and a new nitride film 524 is formed on the entire surfaces of the contact layers 518a, 518b. A resist 525 is patterned at the central part (FIG. 16A). The parts of the nitride film 524 on the contact layers 518a, 518b are etched (FIG. 16B), and a p-electrode material 526 is vaporized on the entire surface (FIG. 16C). The resist 525 is removed wit acetone together with p-electrode material 526 on the surface of the resist 525. Thus the p-electrodes 519a, 519b are formed. Furthermore, the substrate 510 is etched from the underside into a thickness of about 70 μm. Subsequently an n-common electrode 519c is formed on the underside of the substrate 510 and then alloyed at 400° C./min. in a nitrogen ambient atmosphere (FIG. 16D).

Figure 17:
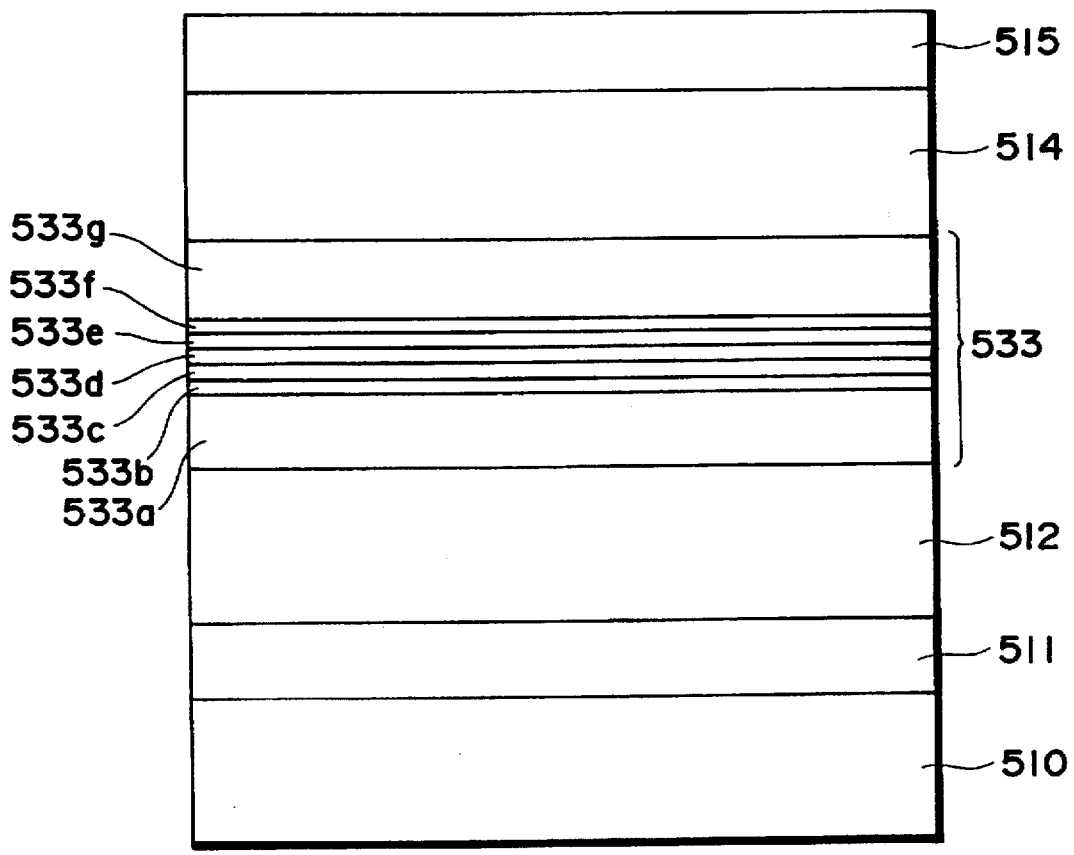
FIG. 17 is a sectional structural view of the semiconductor laser according to one embodiment, which can suppress heat crosstalks.

FIG. 17 shows a sectional structural view of the laser epitaxially grown layers of the multi-beam semiconductor laser according to a second example of this embodiment of this invention. This example differs from the example of FIG. 13 only in the structure of the active layer region. In FIG. 17, the active layer region comprises 0.08 μm- thickness undoped $(Al_{0.4}Ga_{0.6})_{0.5}In_{0.5}P$ layers 533a, 533g, a 0.008 μm-thickness undoped $(Al_{0.4}Ga_{0.6})_{0.5}In_{0.5}P$ layers 533c, 533e, and 0.01 μm-thickness $Ga_{0.43}In_{0.57}P$ layers 533b, 533d, 533f. Thus a visible multi (double)-beam semiconductor laser can be fabricated.

Subsequently crosstalks of this visible multi-beam semiconductor laser were actually measured. In the measurement, first it was confirmed that the two laser resonators had substantially the same characteristics and have sufficiently small photo-crosstalks, and their currents at beam output of 6 mW were measured. Then the driving regions of the two laser resonators were short-circuited; and current Iab and external differential efficiency (SE) at a beam output of 12 mW were measured. A crosstalk was given by the following equation.

Crosstalk (%)=(Iab−Ia−Ib)·SE/12

The result was that the crosstalk was about 8% at a 500 μm-resonator length. It was confirmed that practical semiconductor lasers can be fabricated. This value is for the case that the reflection surface is not coated. semiconductor laser having below 5% -crosstalks can be fabricated, e.g., by forming a reflection layer of multi-dielectric films on the reflection surface.

A variation of the multi-beam semiconductor laser according to this invention has the current blocking layer 516a~516c formed of $Si_3N_4$.

One means for suppressing heat crosstalks of the multi-beam semiconductor laser is to enhance the radiation of the laser chip to reduce a temperature rise due to the heating. From this viewpoint, it seems disadvantageous to use a dielectric of, e.g., $Si_3N_4$, which has a higher heat resistance than the conventional GaAs crystal. But the studies of the inventors have found that taking into consideration a path of the heat conduction, a higher heat resistance of the current blocking layer 516a~516c are rather advantageous. That is, the heat generated in the active layer region 513 while one laser resonator is being driven is suppressed by the current blocking layer 516a~516c of the high resistance dielectric. Accordingly, a calories conducted to the adjacent laser resonator can be smaller in comparison with the conventional multi-beam semiconductor laser, and heat crosstalks can be accordingly reduced.

This is the case in which the current blocking layer 516a~516c are formed of $SiN_4$ dielectric, but in a case that the current blocking layer is formed of $SiO_2$ or polyimide dielectrics, or of AlInP mixed crystal or AlGaInP mixed crystal, the same advantageous effect can be achieved.

Figure 18:
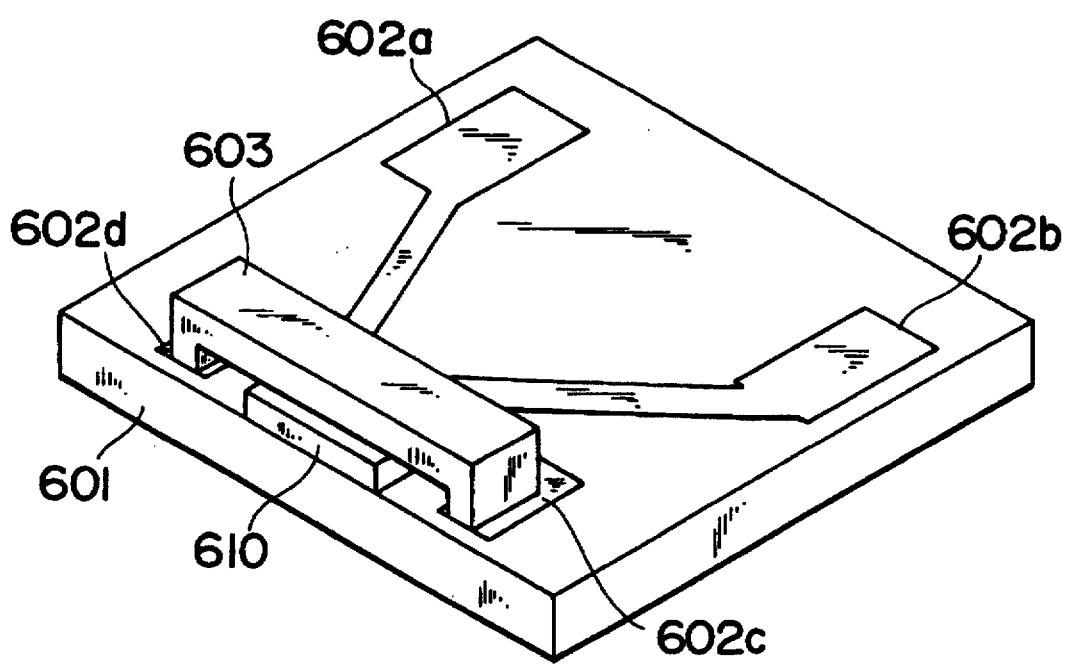
FIG. 18 is a view of the semiconductor laser according to the embodiment of FIG. 17, which additionally includes radiation means.

FIG. 18 shows the structure of the semiconductor laser according to a fifth embodiment of this invention. This semiconductor laser comprises a chip 610 (of an about 40 μm-thickness) including laser resonators bonded to an electrode plate 601, and a heat-pass wire 603 as a radiator disposed on the side of the substrate of the chip 610.

Electrodes 602a, 602b are formed on the electrode plate by vaporizing gold and gold-tin. The electrodes 602a, 602b, 602c, 602d are electrically connected to the laser resonators on the chip 610. The heat-pass wire 603 is in contact with the substrate of the chip 610 and is formed of, e.g., copper so as to well function as the radiator. The heat-pass wire 603 is electrically connected to the electrodes 602c, 602d. When a current is supplied between the electrodes 602a, 602b and the electrodes 602c, 602d, laser beams are emitted from the laser resonators on the chip 610.

Figures 19A, 19B:
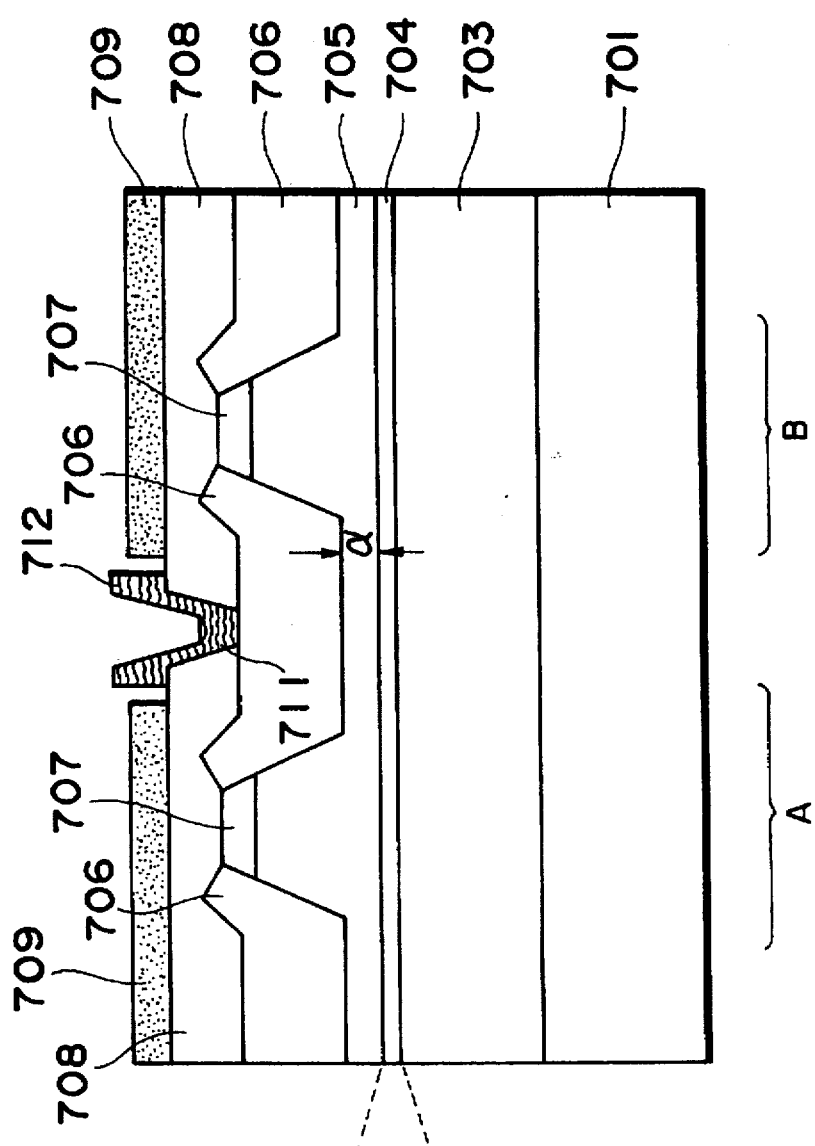
FIGS. 19A and 19B are sectional structural views of the semiconductor laser chip used in the embodiment of FIG. 18.

The chip 610 is a multi-beam semiconductor laser chip, and includes laser resonators on the substrate. FIG. 19B shows the structure of the chip 610. This chip 610 comprises an Se-doped AlGaInP cladding layer 703 (of a 2000 Å-thickness), an active layer 704 of a strain multi-quantum well structure, a Zn-doped AlGaInP cladding layer 705, an Si-doped GaAs current blocking layer 706 and a Zn-doped GaInP cap layer 707 which are sequentially deposited on an Si-doped GaAs substrate 701. A Zn-doped GaAs contact layer 708 and electrodes 709 are formed on the cap layer 707. A silicon nitride film 712 is formed between a light emitting regions A, B, so as to bury a groove 711 for isolating the light emitting regions A, B.

FIG. 19A is an energy band view of the strain multi-quantum well structure of the active layer 704. As shown, the active layer 704 comprises 100 Å-thickness undoped $Ga_{0.43}In_{0.57}P$ well layers 741, undoped $(Al_{0.4}Ga_{0.6})_{0.5}In_{0.5}P$ barrier layers 742 (of a 80 Å-thickness), light confining layers 743 (of a 800 Å-thickness) of the same material as the barrier layers 742. The active layer has the multi-quantum well structure so as to be subjected to a compression strain.

The semiconductor laser of FIG. 18 is fabricated as follows.

The chip 710 is fabricated in a thickness of about 60 µm. This chip 610 is fabricated as follows.

Figure 20A:
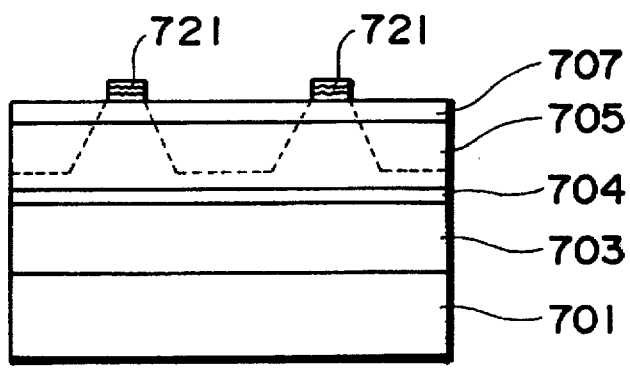
FIGS. 20A to 20D and 21A to 21D are sectional views of the steps for fabricating the semiconductor laser chip used in the embodiment of FIG. 17.

The cladding layer 703, the active layer 704, the cladding layer 705 and the cap layer 707 are epitaxially grown at 740° C. on the GaAs substrate 701 in the stated order, and then a silicon nitride film 721 is formed (FIG. 20A). The doping amounts of the n- and the p-cladding layers are $2×10^{17}$ cm$^{-3}$ and $4×10^{17}$ cm$^{-3}$ respectively, and the thickness of both cladding layers is 1 µm. The silicon nitride film 721 is patterned so as to be the mask for the etching of the parts indicated by the broken line in the next step. For this etching, the etchant is buffered hydrogen fluoride. The width of the two patterned silicon nitride films 721 is 5 µm, and the gap between the both films 721 is 15 µm.

Figure 20B:
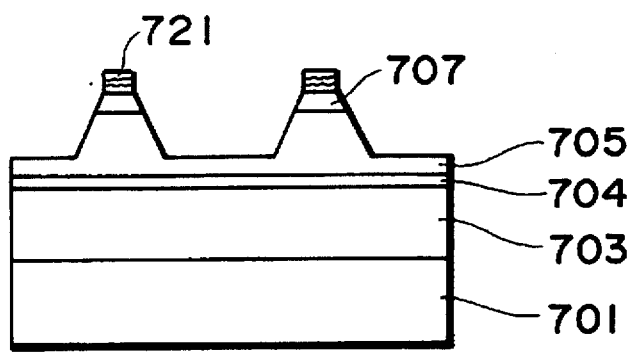
Figure 20C:
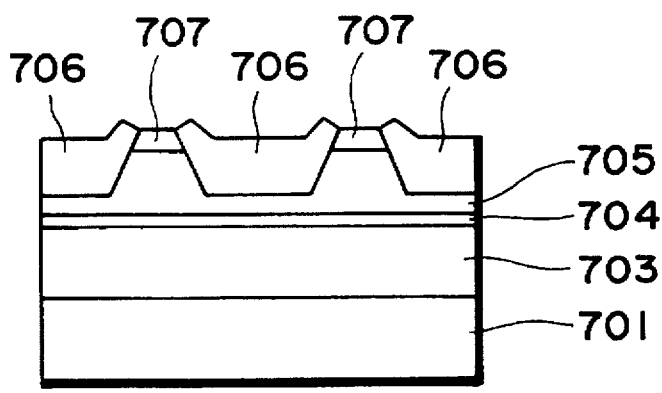
Figure 20D:
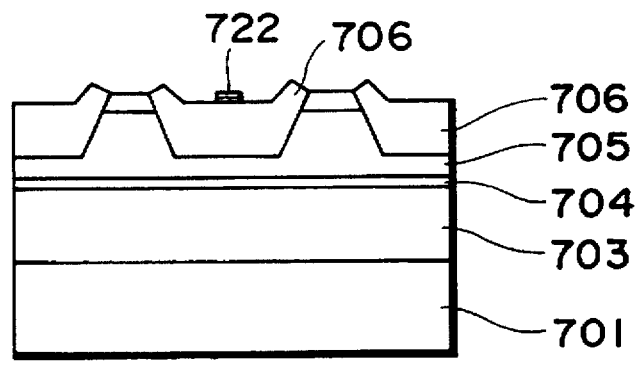

Then mesa-etching follows. The mesa-etching was conducted on the upper cladding layer 705 for 6 minutes using as an etchant a mixed acid (sulfuric acid:hydrogen peroxide:water=3:1:1) of 50° C., and the upper cladding layer 705 was left in a thickness of 2000 Å (FIG. 20B). Si-doped Gas (impurity concentration: $2×10^{17}$ cm$^{-3}$) is grown on the etched-off parts, and the current blocking layer 706 is formed. The silicon nitride films 721 are removed with an etchant (sulfuric acid:water=1:1) (FIG. 20C). Then a silicon nitride film is formed on the entire surface and then is subjected to a resist patterning and etching so that only the part of the silicon nitride film 722 between the light emitting regions A, B is left (FIG. 20D).

Figure 21A:
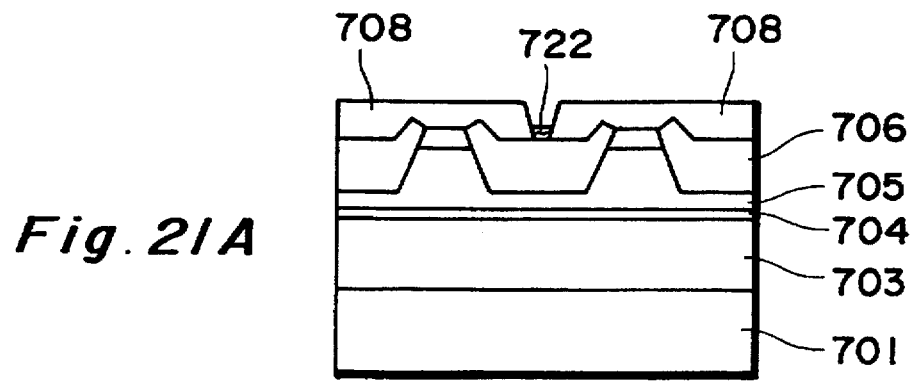
Figure 21B:
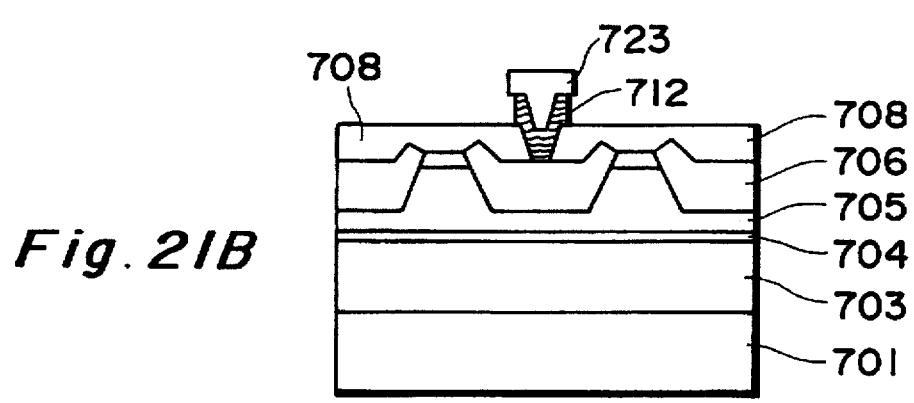
Figure 21C:
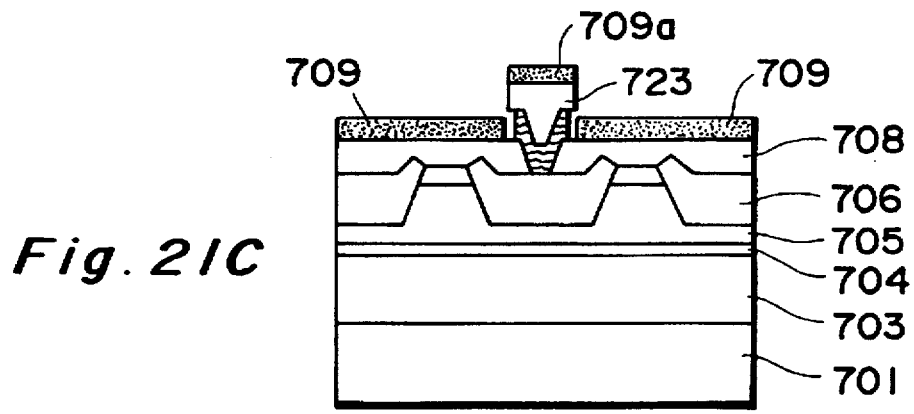
Figure 21D:
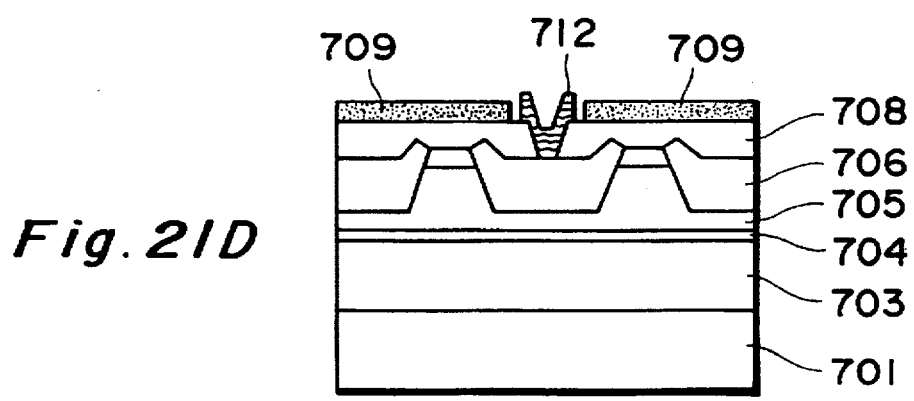

Then a Zn-doped GaAs film (impurity concentration: $1×10^{19}$ cm$^{-3}$) is grown in a thickness of 1 µm, and contact layers 708 are formed spaced from each other by the part where the silicon nitride film 722 is left on (FIG. 21A). Then the left silicon nitride film 722 is removed, and a patterned silicon nitride film 712 is formed on the part isolating the contact layers 708 (FIG. 21B). Metal films 709, 709a of three layers of Ti/Pt/Au are vaporized on the entire surface (FIG. 21C), and then the resist pattern 712 is removed with acetone to lift off the electrodes 709 for the respective laser resonators (FIG. 21D). Then the substrate is etched off from the underside into a thickness of about 70 µm, and subsequently alloyed for 1 minute at 400° C. in a nitrogen ambient atmosphere, and a multi-beam wafer with three laser resonators is prepared.

A resist film is applied to both surfaces of this wafer and this wafer is cleaved into a bar which allows for about 500 µm-length laser resonators. Then a protection film of silicon nitride is vaporized, and the resist is removed with acetone. Since both surfaces of the wafer is applied with the resist film, the protection film of silicon nitride is applied only to the cleaved surfaces, i.e., the end surfaces of the laser resonator. Then the wafer is cut off in an about 400 µm-width, and the chip 610 is prepared.

Figure 22A:
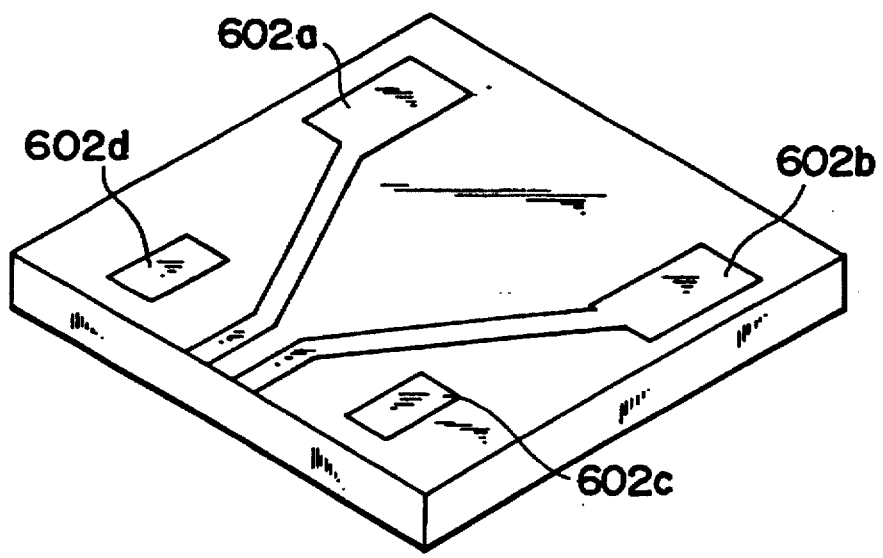
FIG. 22A to 22C are views of the steps of adding heating means to the semiconductor laser chip.

On the other hand, a resist is applied in a required pattern. Gold and gold/tin (tin content: 20%) are vaporized, and then the resist is removed. And an electrode plate 601 with electrodes 602a, 602b, 602c, 602d formed, by lifting-off, spaced from each other by about 50 µm (a gap between the electrodes 709) is prepared (FIG. 22A).

Figure 22B:
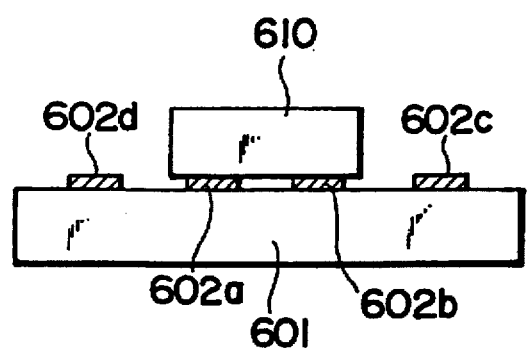

Then the chip 610 is die-bonded with the substrate 701 of the chip 610 upward at about 300° C. so that the electrodes 707 of the chip 610 and the electrodes 601a, 602b are electrically contacted with each other (FIG. 22B). Subsequently the substrate 701 is etched with an etchant (aqueous ammonium:aqueous hydrogen peroxide:water:=9:6:25) into a thickness of about 30 µm. Subsequently a resist is applied to the entire surface except for the part where the chip 610 is disposed (the resist may be applied to a part of the chip 610). A metal which ohmic-contact with the substrate 702 is formed. For example, as described in "J. Appl. Phys., 62(3), 1 Aug. 1987", paradium and germanium are vaporized and annealed, and Ge/PdGe is formed.

Figure 22C:
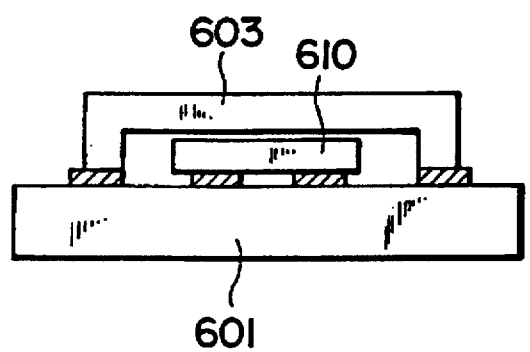

A heat-pass wire 603 is die-bonded to the chip and electrode plat 601 with tin and lead at about 250° C. (FIG. 22C). Subsequently the whole substrate 702 (FIG. 33C) is die-bonded with indium to a heat sink with a copper stem at about 160° C., and the electrodes 602a, 602b, 602c, 602d are wire-bonded, and the semiconductor laser according to this embodiment is completed.

The laser resonators are thus formed on the wafer having a thick, i.e., mechanically strong substrate; which facilitates the treatment of the laser resonators in the fabrication process and makes the laser resonator strong to heat stress. Furthermore, since the etching of the substrate 702 follows the die-bonding of the chip 610, the treatment is easy.

A current was supplied to this semiconductor laser to oscillate the laser, and laser beams of different wavelengths were obtained. In the chip of FIG. 19, a threshold current for the laser oscillation is so low that the heat generation is little. Furthermore, because of the thin substrate 701 of the chip 610, the heat generation is little. Since the thickness d (FIG. 19B) of the cladding layer 705 is small, the heat generated in the region of one laser resonator does not easily reach a neighboring laser resonator, with a result of small crosstalks. Furthermore, because of small heat resistance of the substrate 701, the radiation of the laser resonators as the heat sources is good, and in addition thereto the heat-pass wire 603 functions as a radiator, which further improves the radiation. Since the heat crosstalks can be thus effectively suppressed, even when one of the laser resonators is pulsated, changes of an output of the other laser resonator is retained small.

This invention is not limited to the above-described embodiment, but covers other variations and modifications.

Specifically, the heat-pass wire is used as the radiator in this embodiment, but may be provided by a heat sink in the laser system as long as it functions as the radiator. The radiator may be a thick gold plating. In this embodiment, the substrate is thinned by etching. The etchant may be etchants other than that mentioned above, and the substrate may be mechanically ground as long as the laser resonators are not damaged. The chip 610 includes multi-beam semiconductor laser resonators, but may have a single beam. AlGaInP forming the active layer may have zero Al composition ratio. AlGaInP forming the cladding layers may have zero Ga composition ratio.

From the invention thus described, it will be obvious that the invention may be varied in many ways. Such variations are not to be regarded as a departure from the spirit and scope of the invention, and all such modifications as would be obvious to one skilled in the art are intended to be included within he scope of the following claims.

What is claimed is:

1. A multi-beam semiconductor laser comprising:

a first electrode;

a continuous active layer having a plurality of light emitting regions defined therein, said light emitting regions being independently driven with respect to each other;

a first cladding layer and a second cladding layer positioned such that the continuous active layer is disposed therebetween;

current block means being disposed such that said second cladding layer separates said current block means from said continuous active layer;

a contact layer disposed such that said current block means is positioned intermediate said contact layer and said second cladding layer;

dividing means provided for physically dividing the contact layer to define two areas, said current block means being positioned intermediate said dividing means and said continuous active layer;

an insulator provided in the dividing means, the insulator being in direct contact with both the current block means and the two areas of the contact layer; and second electrodes respectively provided on the two areas of the contact layer, wherein the active layer being formed of an undoped semiconductor mixed crystal, wherein the first cladding layer being formed of a first conduction-type semiconductor mixed crystal, and wherein the second cladding layer being formed of a second conduction-type semiconductor mixed crystal.

2. A multi-beam semiconductor laser according to claim 1, wherein the active layer is formed of at least one of GaAs, AlInAS, InGaAs.

3. A multi-beam semiconductor laser according claim 1, wherein each of the first cladding layer and the second cladding layer is formed of at least one of GaInP, AlGaInP, AlInP.

4. A multi-beam semiconductor laser according to claim 1, wherein an interval between centers of the two areas into which the contact layer is divided is no greater than 30 μm.

5. A multi-beam semiconductor laser according to claim 1, wherein the current block means is spaced from the active layer with a predetermined distance.

6. A multi-beam semiconductor laser according to claim 5, wherein the current block means is formed of a dielectric material.

7. A multi-beam semiconductor laser according to claim 6, wherein the dielectric material is at least one of silicon nitride and silicon oxide.

8. A multi-beam semiconductor laser according to claim 6, wherein the current block means is formed of at least one of AlGaInP and AlInP.

9. A multi-beam semiconductor laser according to claim 11, wherein the current block means is formed of a semiconductor mixed crystal.

10. A multi-beam semiconductor laser according to claim 1, wherein said insulator is formed of a dielectric material.

11. A multi-beam semiconductor laser comprising:

a first electrode;

a continuous active layer having a plurality of light emitting regions defined therein, said light emitting regions being independently driven with respect to each other;

a first cladding layer and a second cladding layer positioned such that said continuous active layer is located therebetween, and said first cladding layer being disposed between said first electrode and said continuous active layer;

current block means being disposed such that said second cladding layer separates said current block means from said continuous active layer;

a contact layer being defined by at least two individual regions provided on said current block means, said individual regions being spaced from one another by a predetermined distance, each of said two individual regions of said contact layer contacting said current block means while overlapping said current block means;

an insulator provided between said two individual regions of said contact layer, said insulator being in direct contact with both said current block means and said two individual regions of said contact layer while being spaced from the continuous active layer by the current block means; and at least two second individual electrodes respectively provided on said individual regions of said contact layer, said second individual electrodes disposed so that said active layer is positioned between said first electrode and said second individual electrodes;

wherein said active layer is formed of an undoped semiconductor mixed crystal;

wherein said first cladding layer is formed of a first conduction-type semiconductor mixed crystal; and wherein said second cladding layer is formed of a second conduction-type semiconductor mixed crystal.

12. A multi-beam semiconductor laser according to claim 11, wherein said active layer has a structure comprising:

at least one quantum well region having a well layer and two barrier layers sandwiching the well layer, said barrier layers respectively having a higher energy bandgap than said well layer; and two light confining regions sandwiching said quantum well region.

13. A multi-beam semiconductor laser according to claim 11, further comprising:

heating means for generating pre-heat equivalent to oscillation heat generated in said active layer, said heating means including:

a third electrode provided on said individual region of said contact layer; and a heating layer being a part in said active layer and sandwiched between said third electrode and said first electrode.

14. A multi-beam semiconductor laser according to claim 11, further comprising:

heating means for generating pre-heat equivalent to oscillation heat generated in said active layer, said heating means including at least one resistor member provided on each of said second individual electrodes.

15. A multi-beam semiconductor laser according to claim 11, further comprising:

deterioration detecting means for detecting deterioration of an active part in said active layer; adapted to be a beam emitting region when a desired current flows from one of said second individual electrodes; and driving switching means for stopping the current supply to said electrode when said deterioration detecting means has detected deterioration of said active part, and for flowing said desired current from the other of said second individual electrodes.

16. A multi-beam semiconductor laser according to claim 15, wherein said deterioration detecting means detects the deterioration of said active part based upon intensity of a laser beam emitted from said active part.

17. A multi-beam semiconductor laser according to claim 15, wherein said deterioration detecting means detects the deterioration of said-active part by measuring an electric power generated in one of said second individual electrodes based on a laser beam emitted from said active part.

18. A multi-beam semiconductor laser according to claim 11, further comprising at least one monitoring electrode provided on said individual region of said contact layer, said monitoring electrode detecting deterioration of an active part in said active layer adapted to be a beam emitting region when a desired current flows from one of said second individual electrodes by measuring an electric power generated in the other of said second individual electrodes, based on a laser beam emitted from said active part.

19. A multi-beam semiconductor laser according to claim 11, further comprising at least one monitoring electrode provided on said individual region of said contact layer, said monitoring electrode detecting deterioration of an active part in said active layer adapted to be a beam emitting region when a desired current flows from one of said second individual electrodes, based on an intensity of a laser beam emitted from said active part.

20. A multi-beam semiconductor laser according to claim 11, further comprising heat radiating means for reducing a temperature rise resulting from heating of said multi-beam semiconductor laser.

21. A multi-beam semiconductor laser according to claim 20, wherein said heat radiating means is a heat-pass wire.

22. A multi-beam semiconductor laser according to claim 11, wherein said insulator is formed of a dielectric material.

* * * * *